US008912089B2

(12) United States Patent
Omoto et al.

(10) Patent No.: US 8,912,089 B2
(45) Date of Patent: Dec. 16, 2014

(54) METHOD FOR MANUFACTURING A SEMICONDUCTOR DEVICE INCLUDING A STACKED BODY COMPRISING PLURALITIES OF FIRST AND SECOND METALLIC CONDUCTIVE LAYERS

(71) Applicant: Kabushiki Kaisha Toshiba, Tokyo (JP)

(72) Inventors: Seiichi Omoto, Mie-ken (JP); Yoshihiro Uozumi, Aichi-ken (JP); Tadashi Iguchi, Mie-ken (JP); Osamu Yamane, Kanagawa-ken (JP); Kazuyuki Masukawa, Kanagawa-ken (JP); Yoshihiro Yanai, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/848,294

(22) Filed: Mar. 21, 2013

(65) Prior Publication Data
US 2014/0061752 A1 Mar. 6, 2014

Related U.S. Application Data

(60) Provisional application No. 61/697,048, filed on Sep. 5, 2012.

(51) Int. Cl.
*H01L 21/4763* (2006.01)
*H01L 27/115* (2006.01)
*H01L 29/792* (2006.01)
*H01L 29/66* (2006.01)
*H01L 29/78* (2006.01)
*H01L 29/788* (2006.01)

(52) U.S. Cl.
CPC .... *H01L 29/66666* (2013.01); *H01L 27/11565* (2013.01); *H01L 29/7926* (2013.01); *H01L 29/66833* (2013.01); *H01L 29/7827* (2013.01); *H01L 29/7889* (2013.01); *H01L 29/66825* (2013.01); *H01L 27/11582* (2013.01); *H01L 27/11575* (2013.01)
USPC 438/622; 438/287; 257/E21.21; 257/E21.423; 257/E21.495; 257/E21.577; 257/E21.693

(58) Field of Classification Search
CPC ............... H01L 27/11578; H01L 27/11582; H01L 27/11551; H01L 29/7926; H01L 29/66833; H01L 21/8221; H01L 23/5226
USPC ............ 257/E21.21, E21.423, E21.495, 257/E21.577, E21.693; 438/622, 287
See application file for complete search history.

(56) References Cited

U.S. PATENT DOCUMENTS

2008/0253183 A1  10/2008  Mizukami et al.
2009/0020744 A1  1/2009  Mizukami et al.
(Continued)

FOREIGN PATENT DOCUMENTS

JP  2008-258458 A  10/2008
JP  2008-263029 A  10/2008
(Continued)

*Primary Examiner* — Howard Weiss
(74) *Attorney, Agent, or Firm* — Oblon, Spivak, McClelland, Maier & Neustadt, L.L.P.

(57) ABSTRACT

According to one embodiment, a method for manufacturing a semiconductor device includes forming a stacked body on a substrate. The stacked body includes a plurality of first conductive layers including a metallic element as a main component and a plurality of second conductive layers including a metallic element as a main component provided respectively between the first conductive layers. The method includes making a hole to pierce the stacked body. The method includes making a slit to divide the stacked body. The method includes making a gap between the first conductive layers by removing the second conductive layers by etching via the slit or the hole. The method includes forming a memory film including a charge storage film at a side wall of the hole. The method includes forming a channel body on an inner side of the memory film inside the hole.

17 Claims, 29 Drawing Sheets

(56) References Cited

U.S. PATENT DOCUMENTS

| | | |
|---|---|---|
| 2010/0052042 A1 | 3/2010 | Tanaka et al. |
| 2010/0109071 A1 | 5/2010 | Tanaka et al. |
| 2010/0301405 A1 | 12/2010 | Oota et al. |
| 2011/0031547 A1 | 2/2011 | Watanabe |
| 2011/0233648 A1 | 9/2011 | Seol et al. |
| 2011/0303969 A1 | 12/2011 | Kai et al. |
| 2012/0061743 A1 | 3/2012 | Watanabe et al. |

FOREIGN PATENT DOCUMENTS

| | | |
|---|---|---|
| JP | 2009-16400 A | 1/2009 |
| JP | 2010-114113 A | 5/2010 |
| JP | 2010-278233 A | 12/2010 |
| JP | 2011-40533 A | 2/2011 |
| JP | 2011-49561 A | 3/2011 |
| JP | 2011-211200 A | 10/2011 |
| JP | 2012-4249 A | 1/2012 |
| JP | 2012-59966 A | 3/2012 |

# METHOD FOR MANUFACTURING A SEMICONDUCTOR DEVICE INCLUDING A STACKED BODY COMPRISING PLURALITIES OF FIRST AND SECOND METALLIC CONDUCTIVE LAYERS

CROSS-REFERENCE TO RELATED APPLICATION

This application is based upon and claims the benefit of priority from the prior U.S. Provisional Patent Application 61/697,048, filed on Sep. 5, 2012; the entire contents of which are incorporated herein by reference.

FIELD

Embodiments described herein relate generally to a method for manufacturing a semiconductor device and a semiconductor device.

BACKGROUND

A memory device having a three-dimensional structure has been proposed in which memory holes are made in a stacked body in which insulating layers are multiply stacked alternately with conductive layers that function as control gates of memory cells, and silicon bodies used to form channels are provided on the side walls of the memory holes with a charge storage film interposed between the silicon bodies and the side walls.

As the conductive layer, a silicon layer doped with an impurity has been proposed; and it has also been proposed to perform metal siliciding of a portion of the silicon layer to reduce the resistance of the conductive layer. A conductive layer of a metal layer also has been proposed.

Also, as a structure to respectively connect the multiple conductive layers that are stacked to other interconnect layers, technology has been proposed in which the multiple conductive layers are patterned into a stairstep configuration, and multiple contact holes having different depths that reach the conductive layers of each level are made simultaneously. In the simultaneous patterning of the multiple contact holes having the different depths, a difficult control is necessary to stop the etching at the conductive layer of each level.

DETAILED DESCRIPTION

Figure 1:
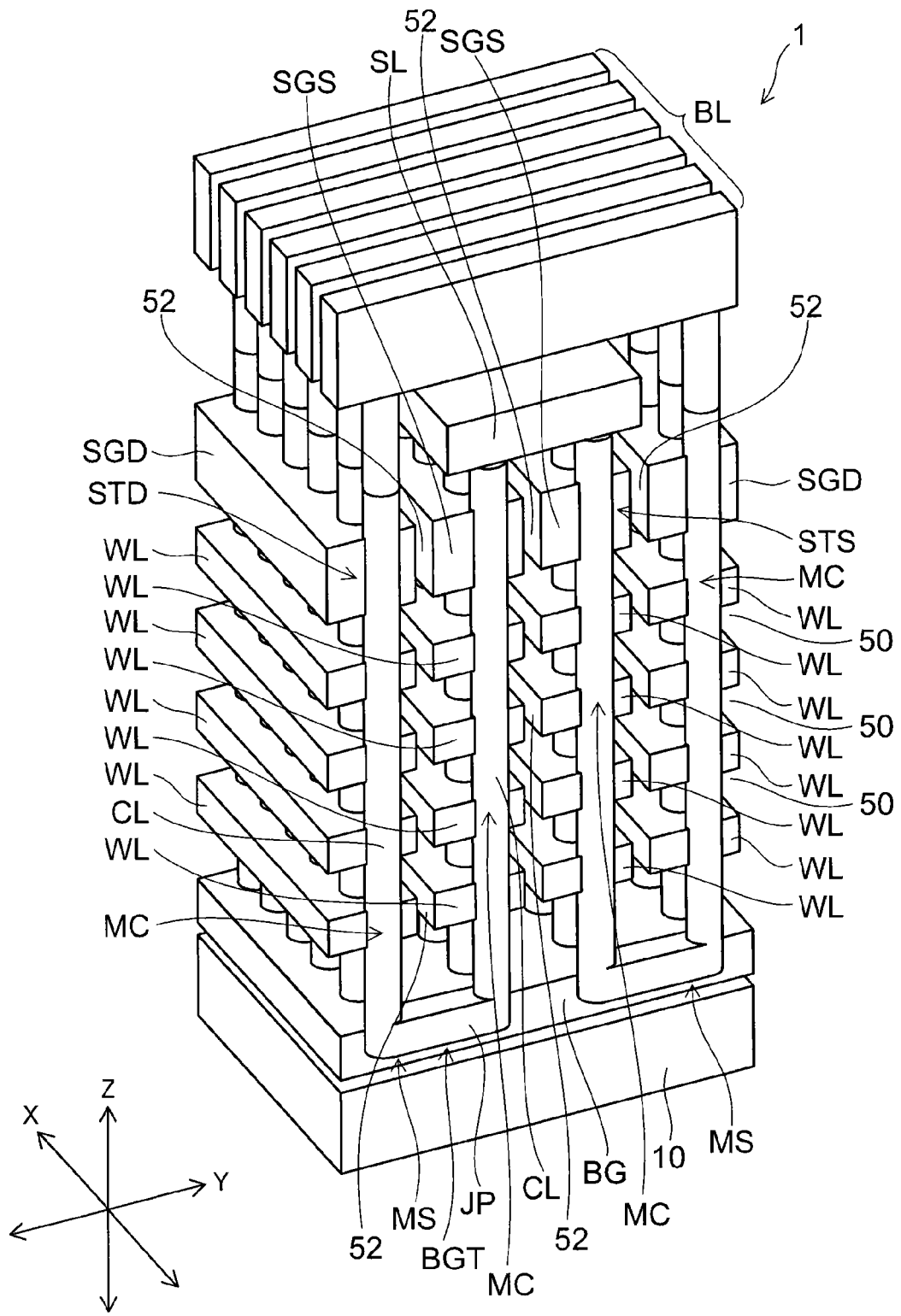
FIG. 1 is a schematic perspective view of a memory cell array of a semiconductor device of an embodiment.

According to one embodiment, a method for manufacturing a semiconductor device includes forming a stacked body on a substrate. The stacked body includes a plurality of first conductive layers including a metallic element as a main component and a plurality of second conductive layers including a metallic element as a main component provided respectively between the first conductive layers. The method includes making a hole to pierce the stacked body. The method includes making a slit to divide the stacked body. The method includes making a gap between the first conductive layers by removing the second conductive layers by etching via the slit or the hole. The method includes forming a memory film including a charge storage film at a side wall of the hole. The method includes forming a channel body on an inner side of the memory film inside the hole.

Embodiments will now be described with reference to the drawings. Similar components in the drawings are marked with like reference numerals.

FIG. 1 is a schematic perspective view of a memory cell array 1 of a semiconductor device of the embodiment. The insulating films are not shown for easier viewing of the drawing in FIG. 1.

An XYZ orthogonal coordinate system is introduced in FIG. 1. Two mutually orthogonal directions that are parallel to the major surface of a substrate 10 are taken as an X direction (a second direction) and a Y direction (a first direction); and a direction orthogonal to both the X direction and the Y direction is taken as a Z direction (a third direction or a stacking direction).

Figure 5A:
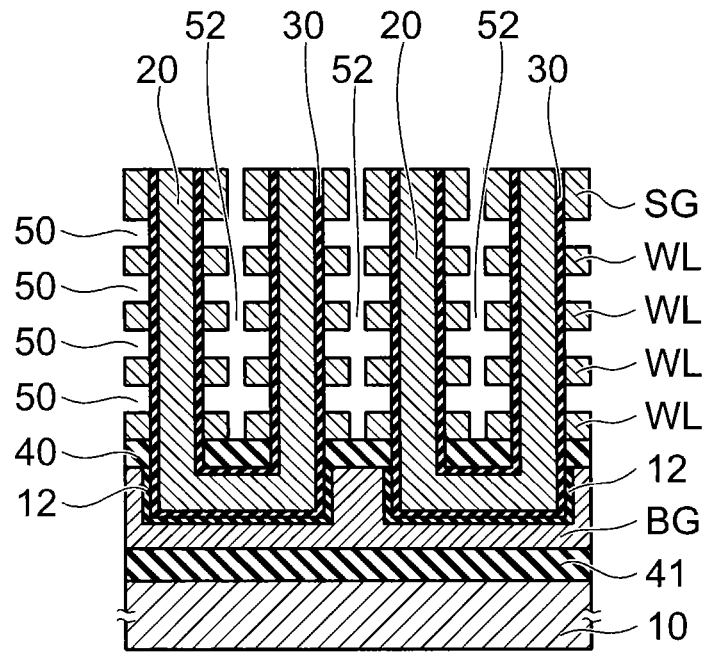
Figure 5B:
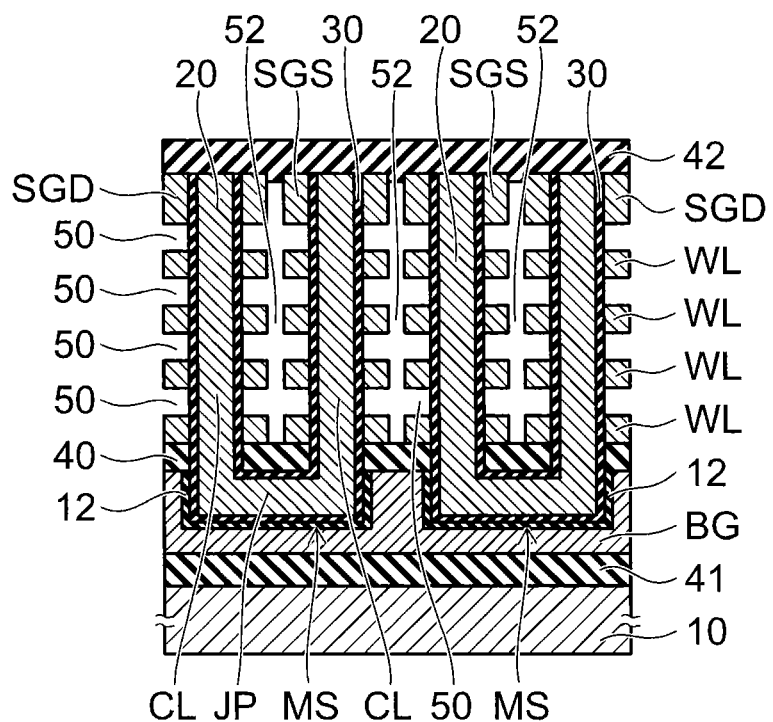

FIG. 5B is a schematic cross-sectional view of the memory cell array 1 and shows a cross section parallel to the YZ plane of FIG. 1.

The memory cell array 1 includes multiple memory strings MS. One memory string MS is formed in a U-shaped configuration including a pair of columnar portions CL extending in the Z direction and a linking portion JP that links the lower ends of the pair of columnar portions CL.

Figure 2:
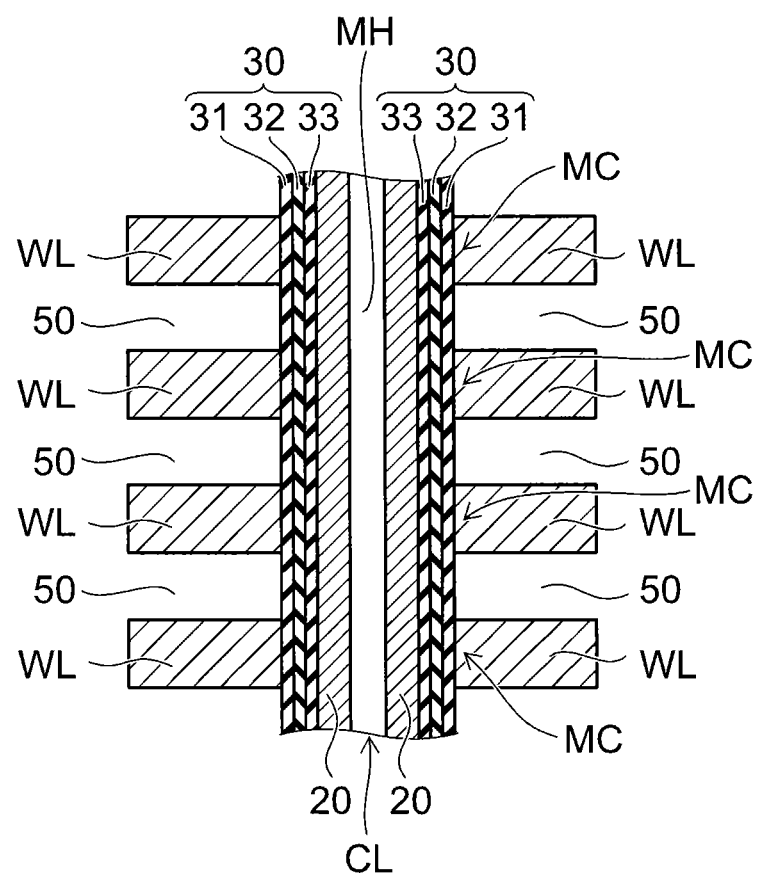
FIG. 2 is a schematic cross-sectional view of a memory cell of the semiconductor device of the embodiment.

FIG. 2 is an enlarged cross-sectional view of the columnar portion CL of the memory string MS.

As shown in FIG. 5B, a back gate BG is provided on the substrate 10 with an insulating film 41 interposed. The back gate BG is, for example, a polycrystalline silicon layer into which an impurity is added and is conductive.

As first conductive layers, multiple electrode layers WL are stacked in the Z direction with a gap 50 interposed between the first conductive layers on the back gate BG with an insulating film 40 interposed between the back gate BG and the multiple electrode layers WL. The gap 50 is provided between the electrode layers WL of the different layers. The insulating film 40 is provided between the back gate BG and the electrode layer WL of the lowermost layer. Although, for example, four layers of the electrode layers WL are shown in FIG. 1 and FIG. 5B, the number of layers of the electrode layers WL is arbitrary.

The electrode layers WL include a metallic element as the main component and are, for example, titanium films, tungsten films, aluminum films, copper films, nickel films, or cobalt films.

A drain-side select gate SGD is provided as the first conductive layer at one upper end portion of the pair of columnar portions CL of the memory string MS having the U-shaped configuration; and a source-side select gate SGS is provided at the other upper end portion. The drain-side select gate SGD and the source-side select gate SGS are provided on the electrode layer WL of the uppermost layer with the gap 50 interposed between the drain-side select gate SGD and the electrode layer WL of the uppermost layer and between the source-side select gate SGS and the electrode layer WL of the uppermost layer.

The drain-side select gate SGD and the source-side select gate SGS are of the same material as the electrode layers WL, include metallic elements as the main components, and are, for example, titanium films, tungsten films, aluminum films, copper films, nickel films, or cobalt films.

The thickness of the drain-side select gate SGD and the thickness of the source-side select gate SGS are thicker than the thickness of each of the electrode layers WL.

The drain-side select gate SGD and the source-side select gate SGS are divided in the Y direction by a slit 52. The electrode layers WL stacked under the drain-side select gate SGD and the electrode layers WL stacked under the source-side select gate SGS also are divided in the Y direction by the slit 52. The stacked body including the multiple electrode layers WL between the memory strings MS adjacent to each other in the Y direction also is divided in the Y direction by the slit 52. The slit 52 communicates with the gap 50.

A source line SL shown in FIG. 1 is provided on the source-side select gate SGS with an insulating film 42 shown in FIG. 5B interposed. The source line SL is, for example, a metal film.

Bit lines BL shown in FIG. 1 which are multiple metal interconnects are provided on the drain-side select gate SGD and the source line SL with the insulating film 42 shown in FIG. 5B interposed between the drain-side select gate SGD and the bit lines BL and between the source line SL and the bit lines BL. Each of the bit lines BL extends in the Y direction.

Figure 4A:
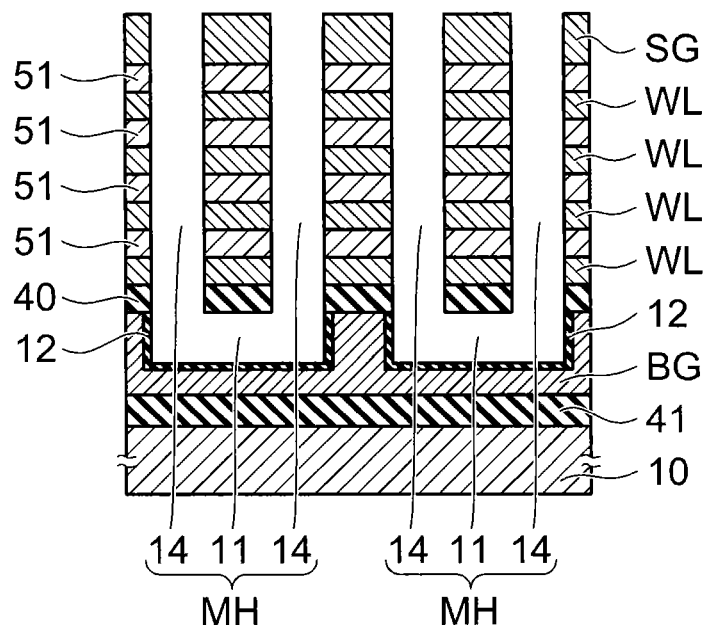

As shown in FIG. 4A described below, a memory hole MH having a U-shaped configuration is made in the stacked body that includes the back gate BG, the insulating film 40, the multiple electrode layers WL, the drain-side select gate SGD, and the source-side select gate SGS. A channel body 20 is formed inside the memory hole MH with a memory film 30 interposed.

The channel body 20 is, for example, a silicon film. The memory film 30 is provided between the channel body 20 and the side wall of the memory hole MH as shown in FIG. 2.

Although a structure in which the channel body 20 is provided such that a hollow portion remains at the central axis side of the memory hole MH is shown in FIG. 2, this may be a structure in which the entire interior of the memory hole MH is filled with the channel body 20, or the hollow portion inside the channel body 20 is filled with an insulator.

The memory film 30 includes a blocking film 31, a charge storage film 32, and a tunneling film 33. The blocking film 31, the charge storage film 32, and the tunneling film 33 are provided in order from the electrode layer WL side between the channel body 20 and each of the electrode layers WL.

The blocking film 31 contacts each of the electrode layers WL; the tunneling film 33 contacts the channel body 20; and the charge storage film 32 is provided between the blocking film 31 and the tunneling film 33.

The channel body 20 functions as a channel of memory cells (transistors) MC; the electrode layers WL function as control gates of the memory cells MC; and the charge storage film 32 functions as a data storage layer that stores the charge injected from the channel body 20. In other words, the memory cells MC having a structure in which the control gate is provided around the channel are formed at the intersections between the channel body 20 and each of the electrode layers WL.

The semiconductor device of the embodiment is a nonvolatile semiconductor memory device that can freely and electrically erase/program data and retain the memory content even when the power supply is OFF.

The memory cell MC is, for example, a charge trap memory cell. The charge storage film 32 has many trap sites that trap the charge and is, for example, a silicon nitride film.

The tunneling film 33 is, for example, a silicon oxide film and is used as a potential barrier when the charge is injected from the channel body 20 into the charge storage film 32 or when the charge stored in the charge storage film 32 diffuses into the channel body 20.

The blocking film 31 is, for example, a silicon oxide film and prevents the charge stored in the charge storage film 32 from diffusing into electrode films WL1 to WL4.

The drain-side select gate SGD, the channel body 20, and the memory film 30 between the drain-side select gate SGD and the channel body 20 are included in a drain-side select transistor STD (shown in FIG. 1). The channel body 20 is connected to the bit line BL above the drain-side select gate SGD. The bit line BL and the channel body 20 are connected via a not-shown bit line contact that pierces the insulating film 42 shown in FIG. 5B.

The source-side select gate SGS, the channel body 20, and the memory film 30 between the source-side select gate SGS and the channel body 20 are included in a source-side select transistor STS (shown in FIG. 1). The channel body 20 is connected to the source line SL above the source-side select gate SGS. The source line SL and the channel body 20 are connected via a not-shown source line contact that pierces the insulating film 42 shown in FIG. 5B.

The back gate BG, the channel body 20 provided inside the back gate BG, and the memory film 30 provided inside the back gate BG are included in a back gate transistor BGT (shown in FIG. 1).

The memory cells MC having the electrode layers WL as control gates are multiply provided between the drain-side select transistor STD and the back gate transistor BGT. Similarly, the memory cells MC having the electrode layers WL as control gates are multiply provided between the back gate transistor BGT and the source-side select transistor STS.

The multiple memory cells MC, the drain-side select transistor STD, the back gate transistor BGT, and the source-side select transistor STS are connected in series via the channel body 20 and are included in one memory string MS having a U-shaped configuration.

By the memory string MS being multiply arranged in the X direction and the Y direction, the multiple memory cells MC are provided three-dimensionally in the X direction, the Y direction, and the Z direction.

Because the gap 50 which has a relative dielectric constant that is lower than those of a silicon oxide film, a silicon nitride film, etc., is provided between the electrode layers WL of the different layers, interference between the memory cells MC can be suppressed.

As the first conductive layer films, the electrode layers WL, the drain-side select gate SGD, and the source-side select gate SGS that include metallic elements as the main components have lower resistances than a semiconductor layer.

A method for forming the memory cell array 1 of the embodiment will now be described.

FIG. 3A to FIG. 5B are schematic cross-sectional views showing the method for manufacturing the memory cell array 1; and FIG. 6A to FIG. 8B are schematic top views showing the method for manufacturing the memory cell array 1.

Figure 3A:
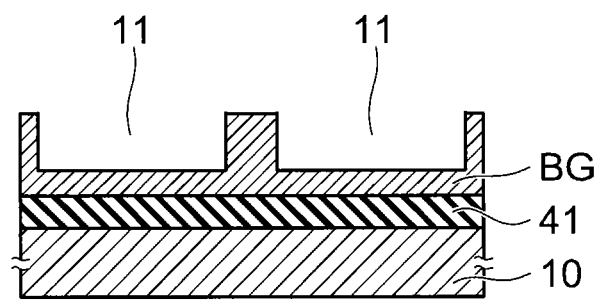
FIG. 3A to FIG. 5B are schematic cross-sectional views showing a method for forming the memory cell array of the semiconductor device of the embodiment.

As shown in FIG. 3A, the back gate BG is formed on the substrate 10 with the insulating film (e.g., the silicon oxide film) 41 interposed. The back gate BG is, for example, a polycrystalline silicon layer doped with phosphorus.

Figure 3B:
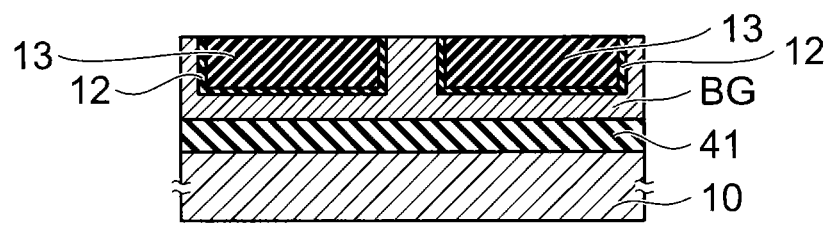
Figure 6A:
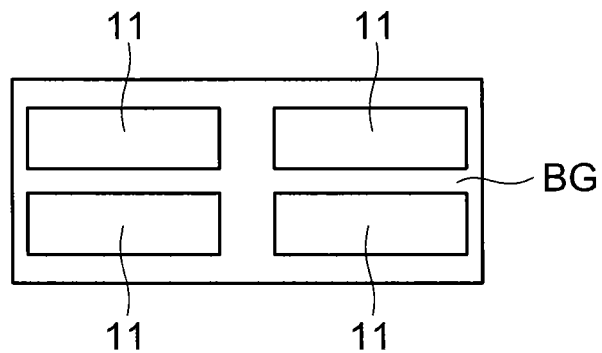
FIG. 6A to FIG. 8B are schematic top views showing a method for forming the memory cell array of the semiconductor device of the embodiment.

Multiple trenches 11 are made in the back gate BG as shown in FIG. 3B and FIG. 6A by etching using a not-shown mask.

Figure 6B:
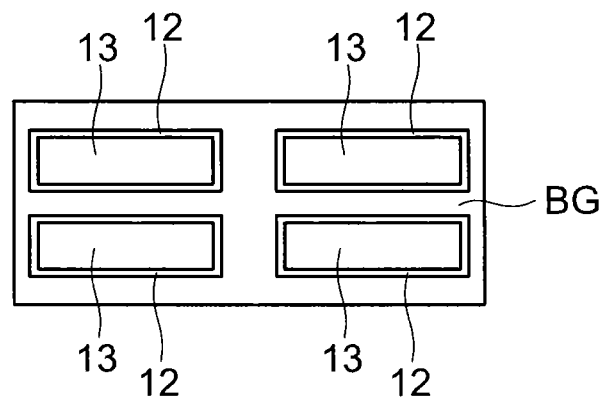

A sacrificial film 13 is filled into the trenches 11 with an insulating film 12 interposed as shown in FIG. 3B and FIG. 6B.

A silicon oxide film is formed as the insulating film 12 by, for example, CVD (chemical vapor deposition).

A resist film is formed as the sacrificial film 13 by, for example, coating. Or, a carbon film is formed as the sacrificial film 13 by, for example, PVD (physical vapor deposition) or CVD.

Figure 3C:
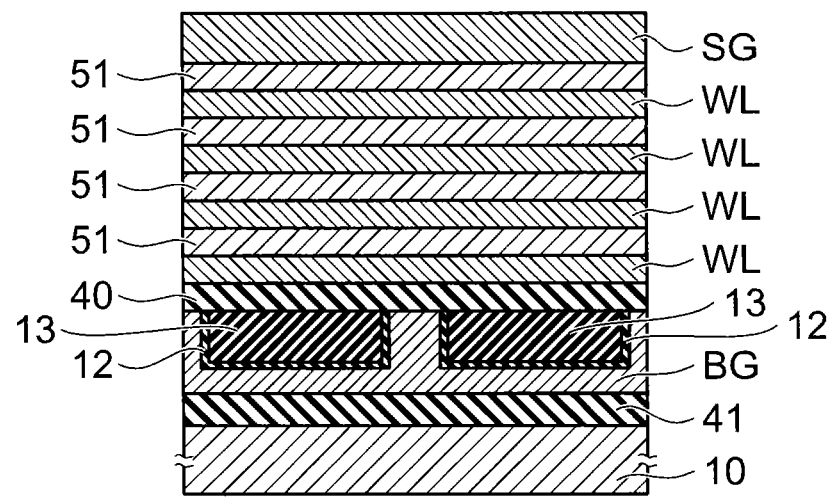
Figure 6C:
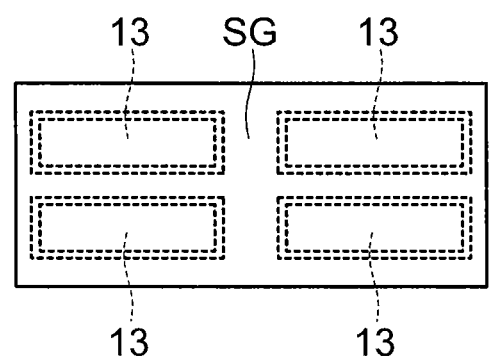

The sacrificial film 13 is planarized by, for example, etchback by RIE (reactive ion etching) or CMP (chemical mechanical polishing). The protrusion upper surface of the back gate BG between the sacrificial films 13 is exposed. The insulating film 40 is formed as shown in FIG. 3C and FIG. 6C on the protrusion upper surface of the back gate BG and the flat surface of the sacrificial film 13; and the electrode layers WL and conductive layers (the second conductive layers) 51 are multiply stacked alternately on the insulating film 40. Further, a select gate SG used to form the drain-side select gate SGD or the source-side select gate SGS is formed on the electrode layer WL of the uppermost layer with the conductive layer 51 interposed.

As the first conductive layers, the electrode layers WL and the select gate SG are, for example, titanium films. As the second conductive layers, the conductive layers 51 are made of a material different from the electrode layers WL and the select gate SG. The conductive layers 51 include, for example, the same metallic element as the electrode layers WL and the select gate SG as the main component and are titanium nitride films.

The conductive layers 51, the electrode layers WL, and the select gate SG are formed by, for example, PVD. Because the conductive layers 51, the electrode layers WL, and the select gate SG include the same metallic element (e.g., titanium) as the main component, the conductive layers 51, the electrode layers WL, and the select gate SG can be formed continuously inside the same chamber by sputtering using a titanium target. In the film formation of the conductive layers 51 which are the titanium nitride films, a nitrogen gas or a gas including nitrogen is introduced to the chamber.

The number of layers of the electrode layers WL is arbitrary and is not limited to four layers. The number of layers of the conductive layers 51 also changes according to the number of layers of the electrode layers WL.

Figure 7A:
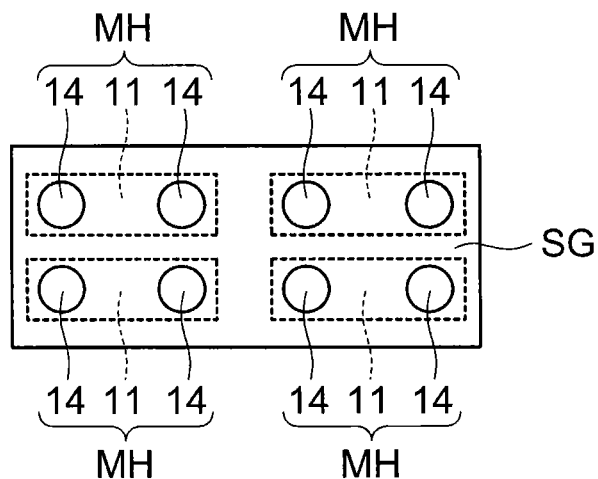

Multiple holes 14 are made as shown in FIG. 4A and FIG. 7A after forming the stacked body including the conductive layers 51, the electrode layers WL, and the select gate SG.

After making the holes 14, the sacrificial film 13 is removed via the holes 14 by etching. By the removal of the sacrificial film 13, the trenches 11 made in the back gate BG in the previous process appear. A pair of holes 14 communicates with one trench 11. In other words, each of the bottoms of the pair of holes 14 communicates with one common trench 11; and one memory hole MH having a U-shaped configuration is made.

The holes 14 are made by, for example, RIE using a not-shown mask and pierce the select gate SG, the multiple conductive layers 51, the multiple electrode layers WL, and the insulating film 40 to reach the sacrificial film 13 prior to being removed. At this time, the setting of the conditions of the RIE and the configuration controllability of the holes 14 are easy because the select gate SG, the conductive layers 51, and the electrode layers WL are films having the same metallic element as the main components.

Figure 4B:
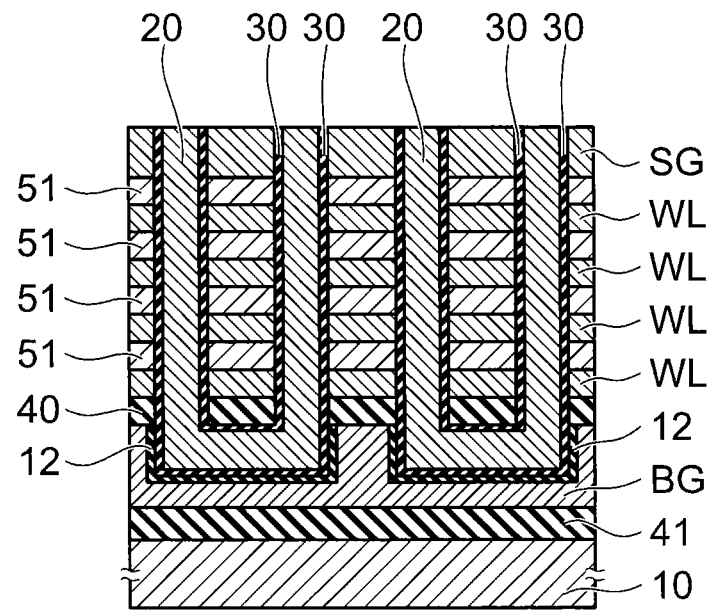
Figure 7B:
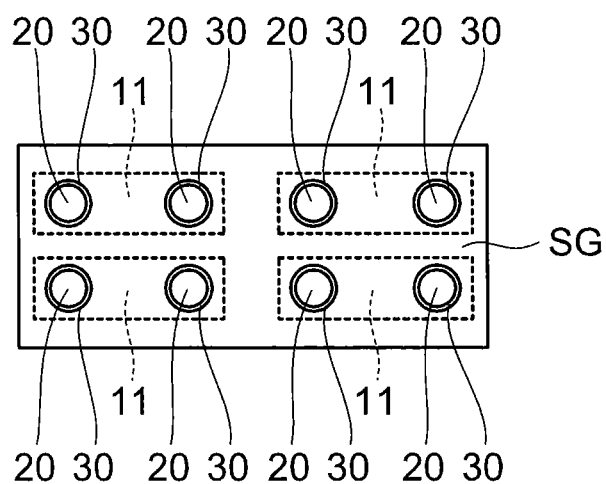

After making the memory hole MH, the memory film 30 is formed on the inner wall of the memory hole MH as shown in FIG. 4B and FIG. 7B. After forming the memory film 30, the channel body 20 is formed on the inner side of the memory film 30 inside the memory hole MH.

Figure 8A:
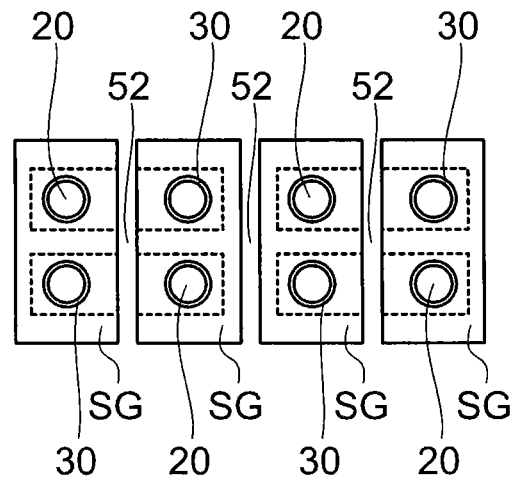

After forming the channel body 20, the multiple slits 52 shown in FIG. 5A and FIG. 8A are made by RIE using a not-shown mask. The slits 52 pierce the select gate SG, the multiple conductive layers 51, and the multiple electrode layers WL to divide the select gate SG, the conductive layers 51, and the electrode layers WL into a plurality in the Y direction of FIG. 1.

After making the slits 52, the conductive layers 51 are removed via the slits 52 by etching.

The conductive layers 51 which are the titanium nitride films are removed by, for example, etching using aqueous hydrogen peroxide to leave the electrode layers WL and the select gate SG which are the titanium films.

Or, in the case where tungsten films including silicon are used as the electrode layers WL and the select gate SG and tungsten films including boron are used as the conductive layers 51, the conductive layers 51 which are the tungsten films including boron can be removed by, for example, etching using ammonium persulfate to leave the electrode layers WL and the select gate SG which are the tungsten films including silicon.

Or, in the case where aluminum films are used as the electrode layers WL and the select gate SG and aluminum nitride films are used as the conductive layers 51, the conductive layers 51 which are the aluminum nitride films can be removed by, for example, etching using a mixed liquid of aqueous hydrogen peroxide and ammonia to leave the electrode layers WL and the select gate SG which are the aluminum films.

Or, in the case where copper films are used as the electrode layers WL and the select gate SG and titanium films or tantalum films are used as the conductive layers 51, the conductive layers 51 which are the titanium films or the tantalum films are removed by, for example, etching using dilute hydrofluoric acid to leave the electrode layers WL and the select gate SG which are the copper films.

Or, in the case where aluminum films are used as the electrode layers WL and the select gate SG and titanium films are used as the conductive layers 51, the conductive layers 51 which are the titanium films can be removed by, for example, etching using nitric acid to leave the electrode layers WL and the select gate SG which are the aluminum films.

Or, in the case where tungsten films are used as the electrode layers WL and the select gate SG and titanium films or tantalum films are used as the conductive layers 51, the conductive layers 51 which are the titanium films or the tantalum films can be removed by, for example, etching using hydrofluoric acid or an ammonium fluoride liquid to leave the electrode layers WL and the select gate SG which are the tungsten films.

Or, in the case where nickel films are used as the electrode layers WL and the select gate SG and titanium films or tantalum films are used as the conductive layers 51, the conductive layers 51 which are the titanium films or the tantalum films can be removed by, for example, etching using hydrofluoric acid or an ammonium fluoride liquid to leave the electrode layers WL and the select gate SG which are the nickel films.

Or, in the case where cobalt films are used as the electrode layers WL and the select gate SG and titanium films are used as the conductive layers 51, the conductive layers 51 which are the titanium films can be removed by, for example, etching using concentrated nitric acid to leave the electrode layers WL and the select gate SG which are the cobalt films.

By the removal of the conductive layers 51, the gap 50 is made between the electrode layers WL and between the select gate SG and the electrode layer WL of the uppermost layer.

The state in which the multiple electrode layers WL and the select gate SG are stacked to be separated by the gap 50 is maintained by the electrode layers WL and the select gate SG being supported by the memory film 30 and the channel body 20 formed inside the holes 14 to extend in the stacking direction of the electrode layers WL and the select gate SG.

Figure 8B:
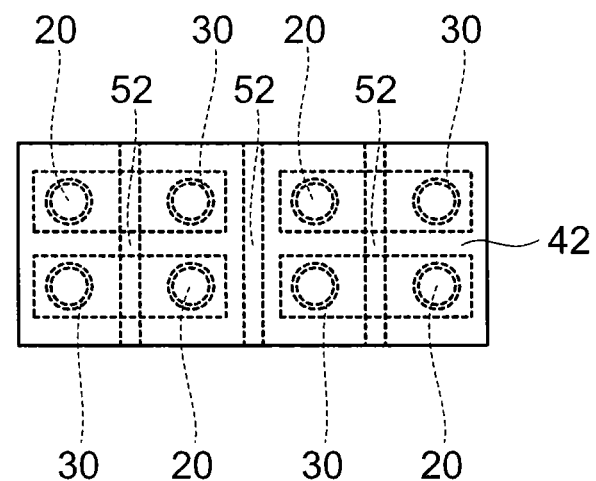

After removing the conductive layers 51, the insulating film 42 is formed on the select gate SG and on the columnar portions CL of the memory string MS as shown in FIG. 5B and FIG. 8B. A silicon oxide film which does not have excellent coverage is formed as the insulating film 42 by, for example, CVD. The formation of the insulating film 42 on the slits 52 stops proximally to the upper end openings of the slits 52.

Accordingly, the state in which the gap 50 is made between the electrode layers WL can be maintained; and a structure that is effective to suppress the interference between the memory cells MC can be provided.

Figure 9:
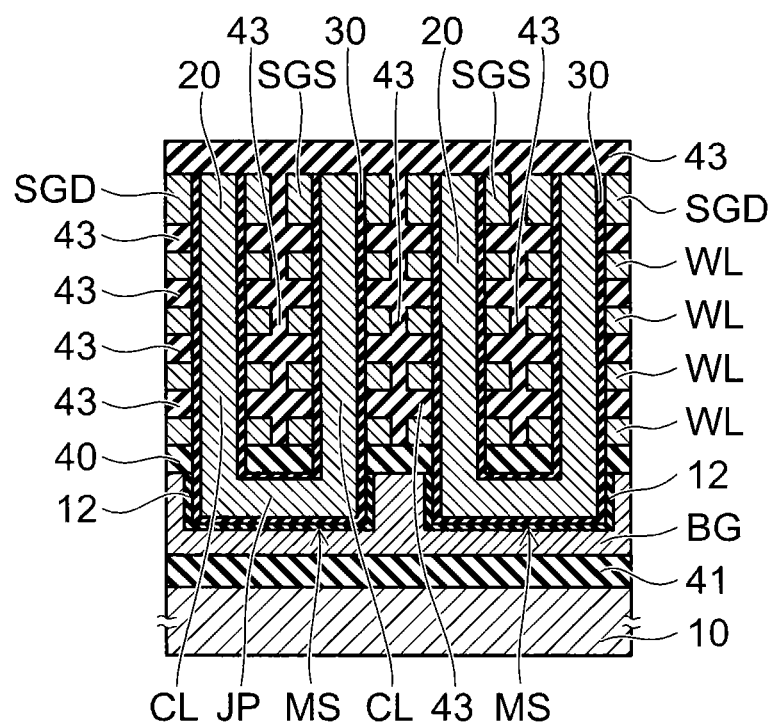
FIG. 9 is a schematic cross-sectional view showing another method for forming the memory cell array of the semiconductor device of the embodiment.

Or, as shown in FIG. 9, a silicon oxide film having excellent coverage may be formed on the select gate SG and on the columnar portions CL as an insulating film 43 by, for example, ALD (atomic layer deposition). The insulating film 43 having excellent coverage also is formed inside the slits 52 and inside the gap 50. The structure of FIG. 9 which does not have the gap has excellent mechanical strength.

After forming the insulating film 42 shown in FIG. 5B or the insulating film 43 shown in FIG. 9, not-shown contacts, the source line SL and the bit lines BL shown in FIG. 1, etc., are formed.

According to the embodiment described above, it is possible to form the electrode layers WL and the select gate SG having low resistance by using the existing mass production technology of the sputtering of metal films and/or metal compound films, etc.

The conductive layers 51 may be removed by etching via the holes 14 instead of the slits 52.

Figure 10A:
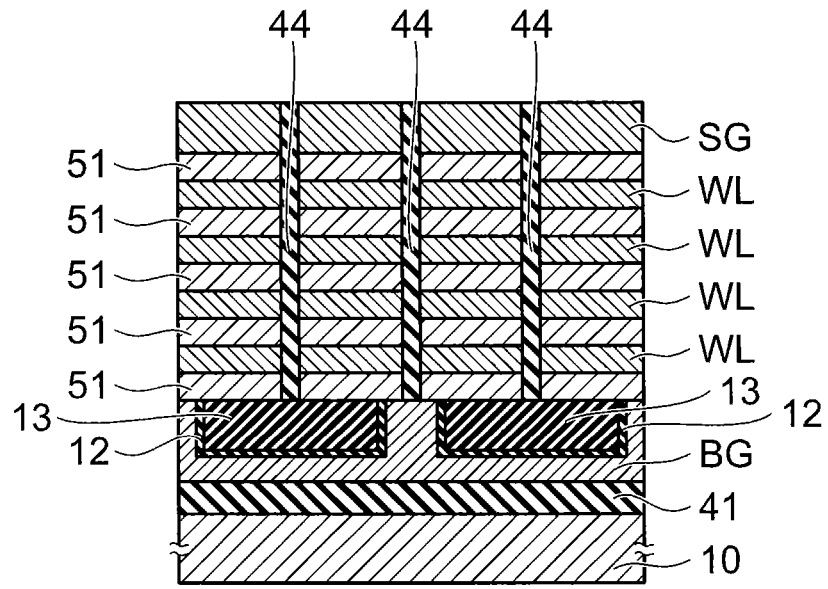
FIGS. 10A and 10B are schematic cross-sectional views showing still another method for forming the memory cell array of the semiconductor device of the embodiment.

In other words, after the process shown in FIG. 3C, the slits are made in the stacked body including the conductive layers 51, the electrode layers WL, and the select gate SG; and an insulating film 44 is filled into the slits as shown in FIG. 10A. In such a case, the layer directly above the back gate BG may be the conductive layer 51 as shown in FIG. 10A instead of the insulating film.

Figure 10B:
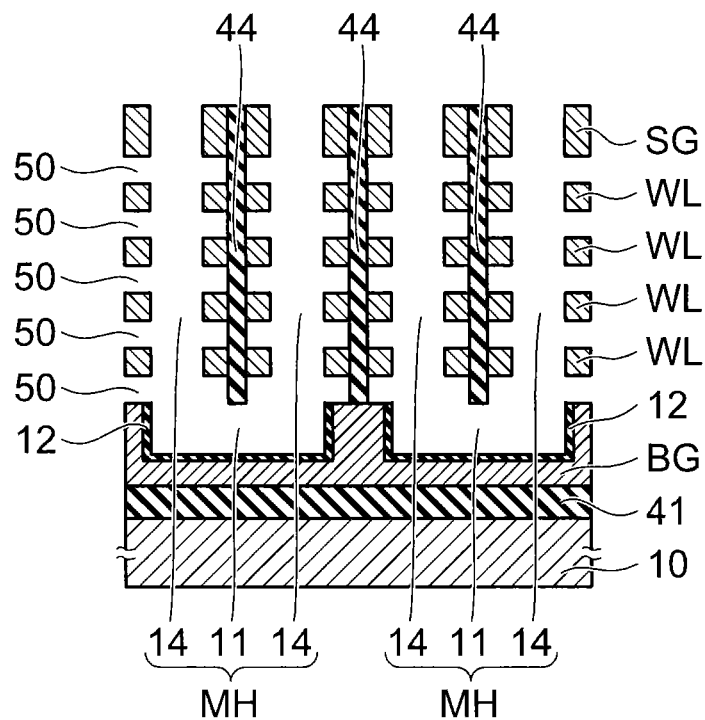

Subsequently, after making the holes 14 that reach the sacrificial film 13, the conductive layers 51 are removed as shown in FIG. 10B by etching via the holes 14. The memory hole MH is made by also removing the sacrificial film 13 by etching via the holes 14.

The state in which the multiple electrode layers WL and the select gate SG are stacked to be separated by the gap 50 is maintained by the electrode layers WL and the select gate SG being supported by the insulating film 44.

Subsequently, the memory film 30 is formed on the inner wall of the memory hole MH. At this time, at least a portion of the film of the memory film 30 which is the stacked film of the multiple films is formed in the gap 50 as an inter-electrode insulating layer. After forming the memory film 30, the channel body 20 is formed on the inner wall of the memory film 30.

The electrode layers WL of the memory cell array 1 of the semiconductor device of the embodiment described above are connected via contact electrodes to not-shown word interconnects formed on the stacked body described above.

Figure 11:
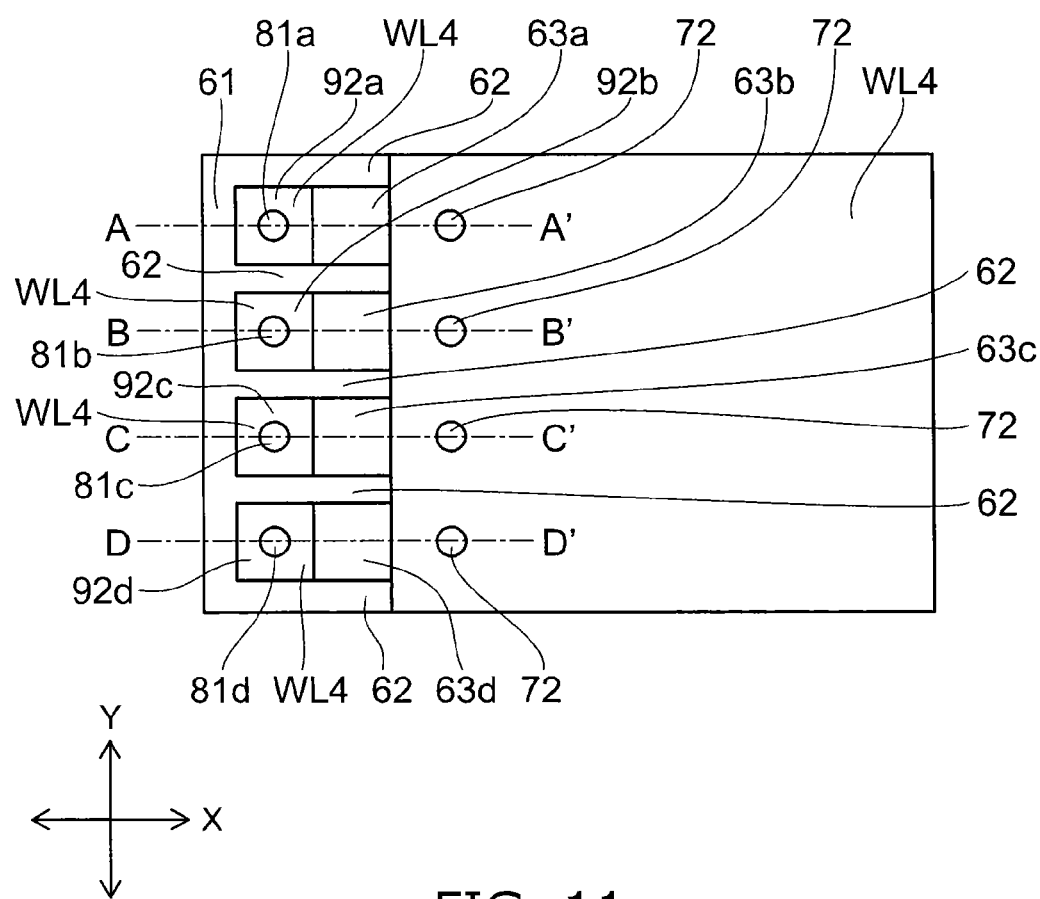
FIG. 11 is a schematic top view of a contact region of the semiconductor device of the embodiment.

FIG. 11 is a schematic top view of a contact region where contact electrodes 81a to 81d are provided.

Figure 12A:
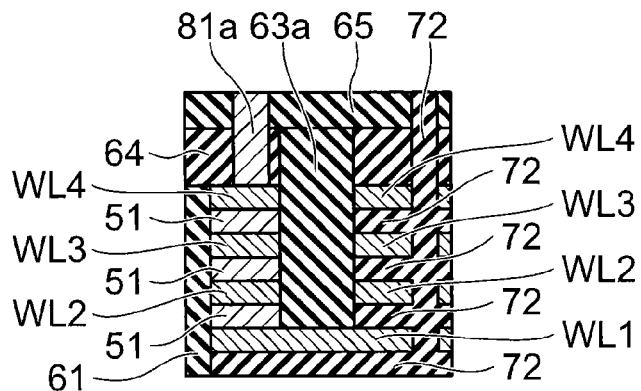
FIGS. 12A to 12D are schematic cross-sectional views of the contact region of the semiconductor device of the embodiment.
Figure 12B:
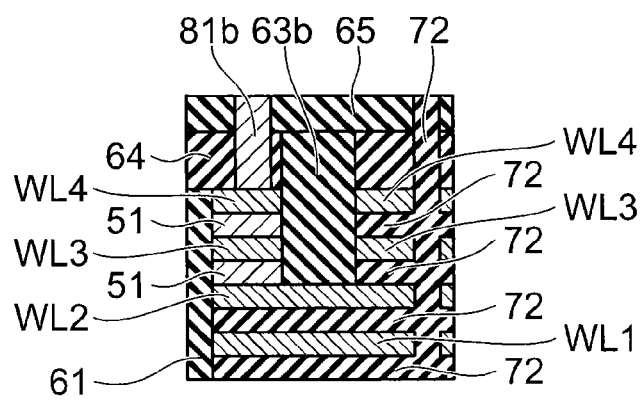
Figure 12C:
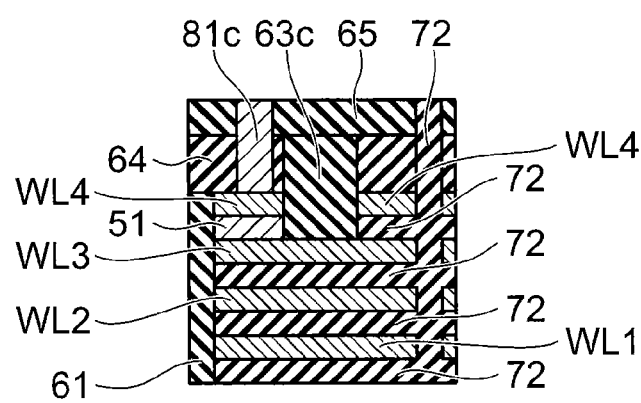
Figure 12D:
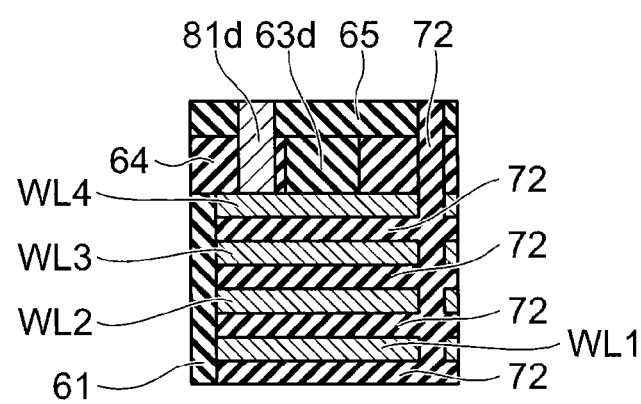

FIG. 12A is an A-A' cross-sectional view of FIG. 11.
FIG. 12B is a B-B' cross-sectional view of FIG. 11.
FIG. 12C is a C-C' cross-sectional view of FIG. 11.
FIG. 12D is a D-D' cross-sectional view of FIG. 11.

A mask layer 64 and an insulating film 65 shown in FIGS. 12A to D are not shown in FIG. 11.

For the four layers of the electrode layers WL in the description hereinbelow, for example, the electrode layer of the lowermost layer is labeled as WL1, the electrode layer of the second layer from the bottom is labeled as WL2, the electrode layer of the third layer from the bottom is labeled as WL3, and the electrode layer of the fourth layer from the bottom (the uppermost layer) is labeled as WL4. There are cases where these are represented as simply the electrode layer WL without discriminating between the electrode layers WL1 to WL4.

The memory cell array 1 described above is formed in, for example, the central region of the chip. The stacked body including the multiple electrode layers WL1 to WL4 is formed also in a region on the outer side of the chip central region where the memory cell array 1 is formed in the X direction of FIG. 1. In other words, each of the electrode layers WL1 to WL4 extends in the X direction from the region where the memory cell array 1 is formed to the contact region shown in FIG. 11.

In the contact region as shown in FIG. 11, an insulating film (a first insulating film) 61 extending in the Y direction is provided. The insulating film 61 pierces the stacked body including the multiple electrode layers WL1 to WL4 as shown in FIGS. 12A to D.

As shown in FIG. 11, multiple insulating films (second insulating films) 62 are provided adjacently to the insulating film 61 in the X direction. The multiple insulating films 62 extend in the X direction in a comb-shaped configuration from one side wall of the insulating film 61. The multiple insulating films 62 are arranged in the Y direction to be separated from each other.

The depths (the heights) of the insulating films 62 are the same as the depth (the height) of the insulating film 61; and the insulating films 62 pierce the stacked body including the multiple electrode layers WL1 to WL4.

Four regions interposed between the insulating films 62 adjacent to each other in the Y direction are provided to correspond to the number of layers of the electrode layers WL1 to WL4. Insulating films 63a to 63d are provided respectively in the regions. Both Y-direction side walls of the insulating films 63a to 63d are adjacent to the insulating films

62. The side walls of the insulating films 63a to 63d on the insulating film 61 side are separated from the insulating film 61.

The insulating films 63a to 63d have mutually different depths (heights) as shown in FIGS. 12A to D to reach the electrode layers WL1 to WL4 of different layers.

As shown in FIG. 12A, the insulating film 63a reaches the electrode layer WL1 of the lowermost layer by piercing the electrode layers WL4 to WL2.

As shown in FIG. 12B, the insulating film 63b reaches the electrode layer WL2 by piercing the electrode layers WL4 and WL3. The insulating film 63b does not pierce the electrode layer WL2 and does not reach the electrode layer WL1.

As shown in FIG. 12C, the insulating film 63c reaches the electrode layer WL3 by piercing the electrode layer WL4. The insulating film 63c does not pierce the electrode layer WL3 and does not reach the electrode layers WL2 and WL1.

As shown in FIG. 12D, the insulating film 63d is provided on the electrode layer WL4 of the uppermost layer. The insulating film 63d does not pierce the electrode layer WL4 and does not reach the electrode layers WL3 to WL1.

As shown in FIG. 12A, the electrode layer WL4, the electrode layer WL3, and the electrode layer WL2 are provided between the insulating film 61 and the insulating film 63a. Further, the conductive layer 51 provided between the electrode layer WL4 and the electrode layer WL3, the conductive layer 51 provided between the electrode layer WL3 and the electrode layer WL2, and the conductive layer 51 provided between the electrode layer WL2 and the electrode layer WL1 are provided between the insulating film 61 and the insulating film 63a.

The conductive layer 51 provided between the electrode layers WL above and below is stacked in contact with the electrode layers WL above and below.

The electrode layers WL and the conductive layers 51 are films including metallic elements as main components as described above. Although the conductive layers 51 are removed in the memory cell array 1, a portion of the conductive layers 51 is left in the contact region as described below; and the electrode layers WL1, WL2, and WL3 other than the electrode layer WL4 of the uppermost layer function as columnar conductors to connect respectively to contact electrodes 81a, 81b, and 81c.

A columnar conductor made of the three layers of the electrode layers WL4, WL3, and WL2 and three layers of the conductive layers 51 is provided between the insulating film 61 and the insulating film 63a. The electrode layer WL4 of the uppermost layer between the insulating film 61 and the insulating film 63a is electrically connected to the electrode layer WL1 of the lowermost layer via the columnar conductor.

The columnar conductor is formed in a quadrilateral columnar configuration; and the columnar conductor is enclosed with the insulating film 61, the insulating films 62, and the insulating film 63a in four directions (at four side walls).

The insulating film 63a separates the electrode layer WL4 extending from the memory cell array 1 side from the electrode layer WL4 of the columnar conductor between the insulating film 61 and the insulating film 63a. Also, the insulating film 63a separates the electrode layer WL3 extending from the memory cell array 1 side from the electrode layer WL3 of the columnar conductor between the insulating film 61 and the insulating film 63a. Further, the insulating film 63a separates the electrode layer WL2 extending from the memory cell array 1 side from the electrode layer WL2 of the columnar conductor between the insulating film 61 and the insulating film 63a.

Moreover, as described below, in a portion other than the portion where the columnar conductor is provided, the conductive layers 51 are removed; and an insulating film 72 is formed between each of the electrode layers WL.

Accordingly, the electrode layers WL of the different layers do not short to each other.

The contact electrode 81a is provided on the electrode layer WL4 of the uppermost layer of the columnar conductor between the insulating film 61 and the insulating film 63a.

The contact electrode 81a is connected to the electrode layer WL4 of the uppermost layer. Accordingly, the contact electrode 81a is electrically connected to the electrode layer WL1 of the lowermost layer via the columnar conductor between the insulating film 61 and the insulating film 63a.

As shown in FIG. 12B, the electrode layer WL4 and the electrode layer WL3 are provided between the insulating film 61 and the insulating film 63b. Further, the conductive layer 51 provided between the electrode layer WL4 and the electrode layer WL3 and the conductive layer 51 provided between the electrode layer WL3 and the electrode layer WL2 are provided between the insulating film 61 and the insulating film 63b.

The columnar conductor made of the two layers of the electrode layers WL4 and WL3 and two layers of the conductive layers 51 is provided between the insulating film 61 and the insulating film 63b. The electrode layer WL4 of the uppermost layer between the insulating film 61 and the insulating film 63b is electrically connected to the electrode layer WL2 of the second layer from the bottom via the columnar conductor.

The columnar conductor between the insulating film 61 and the insulating film 63b is formed in a quadrilateral columnar configuration; and the columnar conductor is enclosed with the insulating film 61, the insulating films 62, and the insulating film 63b in four directions (at four side walls).

The insulating film 63b separates the electrode layer WL4 extending from the memory cell array 1 side from the electrode layer WL4 of the columnar conductor between the insulating film 61 and the insulating film 63b. Also, the insulating film 63b separates the electrode layer WL3 extending from the memory cell array 1 side from the electrode layer WL3 of the columnar conductor between the insulating film 61 and the insulating film 63b. Accordingly, the electrode layers WL of the different layers do not short to each other.

The contact electrode 81b is provided on the electrode layer WL4 of the uppermost layer of the columnar conductor between the insulating film 61 and the insulating film 63b.

The contact electrode 81b is connected to the electrode layer WL4 of the uppermost layer. Accordingly, the contact electrode 81b is electrically connected to the electrode layer WL2 of the second layer from the bottom via the columnar conductor between the insulating film 61 and the insulating film 63b.

As shown in FIG. 12C, the electrode layer WL4 is provided between the insulating film 61 and the insulating film 63c. Further, the conductive layer 51 provided between the electrode layer WL4 and the electrode layer WL3 is provided between the insulating film 61 and the insulating film 63c.

The columnar conductor made of the one layer of the electrode layer WL4 and one layer of the conductive layer 51 is provided between the insulating film 61 and the insulating film 63c. The electrode layer WL4 of the uppermost layer between the insulating film 61 and the insulating film 63c is electrically connected to the electrode layer WL3 of the third layer from the bottom via the columnar conductor.

The columnar conductor between the insulating film 61 and the insulating film 63c is formed in a quadrilateral columnar configuration; and the columnar conductor is enclosed with the insulating film 61, the insulating films 62, and the insulating film 63c in four directions (at four side walls).

The insulating film 63c separates the electrode layer WL4 extending from the memory cell array 1 side from the electrode layer WL4 of the columnar conductor between the insulating film 61 and the insulating film 63c. Accordingly, the electrode layers WL of the different layers do not short to each other.

The contact electrode 81c is provided on the electrode layer WL4 of the uppermost layer of the columnar conductor between the insulating film 61 and the insulating film 63c.

The contact electrode 81c is connected to the electrode layer WL4 of the uppermost layer. Accordingly, the contact electrode 81c is electrically connected to the electrode layer WL3 of the third layer from the bottom via the columnar conductor between the insulating film 61 and the insulating film 63c.

When viewed in the top view shown in FIG. 11, the insulating film 72 is provided and the conductive layers 51 are not interposed between the lower electrode layers WL of the region between the insulating film 61 and the insulating film 63d as shown in FIG. 12D. Also, the contact electrode 81d is provided on the electrode layer WL4 of the uppermost layer of this region.

The contact electrode 81d is connected to the electrode layer WL4 of the uppermost layer. The insulating film 63d does not divide the electrode layer WL4. Accordingly, the contact electrode 81d is electrically connected to the electrode layer WL4

As described below, the conductive layers 51 between the electrode layers WL other than the conductive layers 51 included in the columnar conductors between the insulating film 61 and each of the insulating films 63a to 63c are removed through the hole formed in the stacked body. The insulating film (the fourth insulating film) 72 is formed in the gap between the electrode layers WL that is made by the conductive layers 51 being removed. The insulating film 72 is formed in the gap between the electrode layers WL via the hole used to remove the conductive layers 51; and the insulating film 72 also is formed in the hole.

The mask layer 64 used in the processes that form the insulating films 63a to 63d is provided on the electrode layer WL4 of the uppermost layer of the contact region.

The insulating film 65 is provided on the mask layer 64 and on each of the insulating films 63a to 63d.

Each of the contact electrodes 81a to 81d reaches the electrode layer WL4 of the uppermost layer by piercing the insulating film 65 and the mask layer 64. The contact electrodes 81a to 81d are connected to the not-shown word interconnects provided on the insulating film 65.

Each of the contact electrodes 81a to 81d includes a metallic element as a main component. The columnar conductor that connects the contact electrode 81a and the electrode layer WL1, the columnar conductor that connects the contact electrode 81b and the electrode layer WL2, and the columnar conductor that connects the contact electrode 81c and the electrode layer WL3 also include metallic elements as main components. Accordingly, the resistance of the connection paths between the electrode layers WL1 to WL4 and the word interconnects can be reduced.

A method for forming the contact structure shown in FIG. 11 and FIGS. 12A to D will now be described.

FIG. 13A to FIG. 15C are schematic top views showing the method for forming the contact structure.

FIG. 16A to FIG. 25B are schematic cross-sectional views showing the method for forming the contact structure.

Figure 16A:
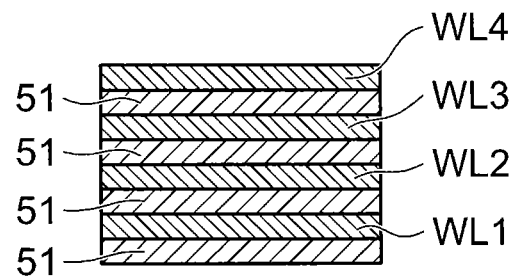

As shown in FIG. 16A, the conductive layers 51 and the electrode layers WL1 to WL4 also are stacked alternately in the contact region by the same processes as the formation of the stacked body of the memory cell array 1.

Figure 13A:
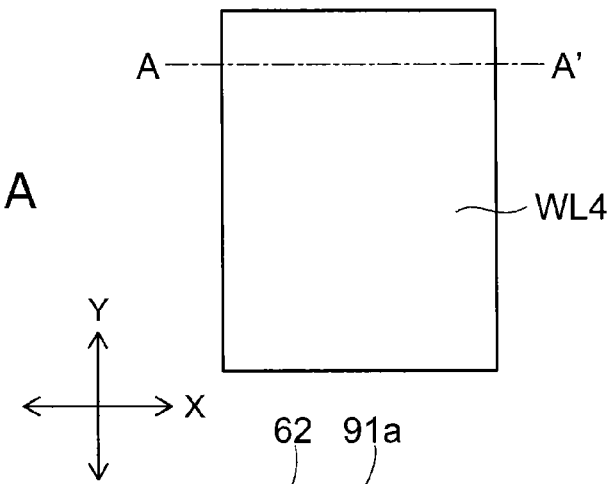
FIG. 13A to FIG. 25B are schematic views showing a method for forming the contact region of the semiconductor device of the embodiment.

FIG. 16A is an A-A' cross-sectional view of FIG. 13A.

The A-A' cross section of FIG. 13A to FIG. 15C corresponds to the cross section of the portion where the contact electrode 81a shown in FIG. 12A is formed.

The B-B' cross section of FIG. 13A to FIG. 15C corresponds to the cross section of the portion where the contact electrode 81b shown in FIG. 12B is formed.

The C-C' cross section of FIG. 13A to FIG. 15C corresponds to the cross section of the portion where the contact electrode 81c shown in FIG. 12C is formed.

The D-D' cross section of FIG. 13A to FIG. 15C corresponds to the cross section of the portion where the contact electrode 81d shown in FIG. 12D is formed.

Figure 13B:
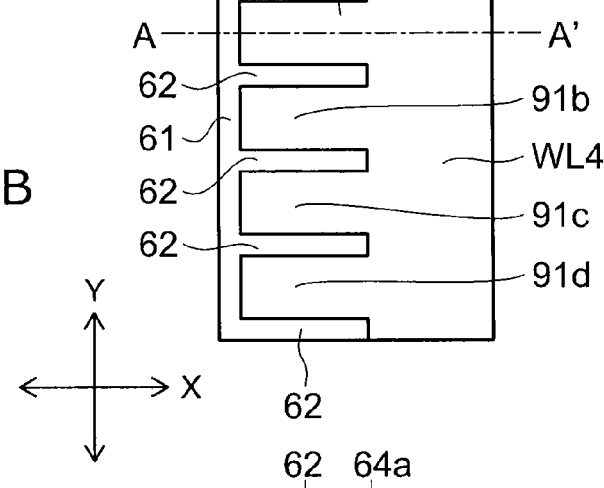

A trench that pierces the stacked body is made in the stacked body of the contact region; and the insulating film 61 and the insulating films 62 are formed inside the trench as shown in FIG. 13B.

The insulating film 61 and the insulating films 62 are formed simultaneously from the same material (e.g., a silicon oxide film).

Figure 16B:
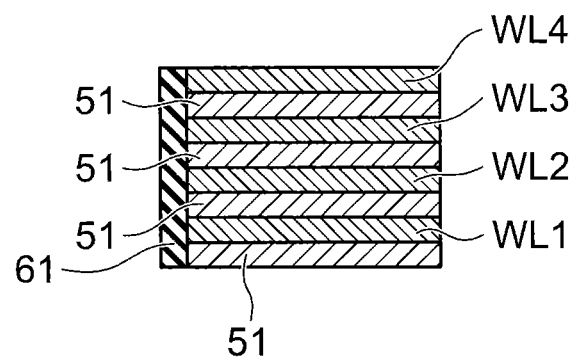

The insulating film 61 extends in the Y direction. Also, as shown in FIG. 16B which is the A-A' cross-sectional view of FIG. 13B, the insulating film 61 pierces the stacked body.

The multiple insulating films 62 are formed to extend from one side wall of the insulating film 61 in the X direction. The insulating films 62 also pierce the stacked body.

Multiple regions 91a to 91d that are enclosed in three directions with a pair of insulating films 62 adjacent to each other in the Y direction and the insulating film 61 formed at one X-direction end portion of the insulating films 62 are formed in the stacked body. Four regions 91a to 91d are formed to correspond to the number of layers of the electrode layers WL1 to WL4 (four layers).

Figure 13C:
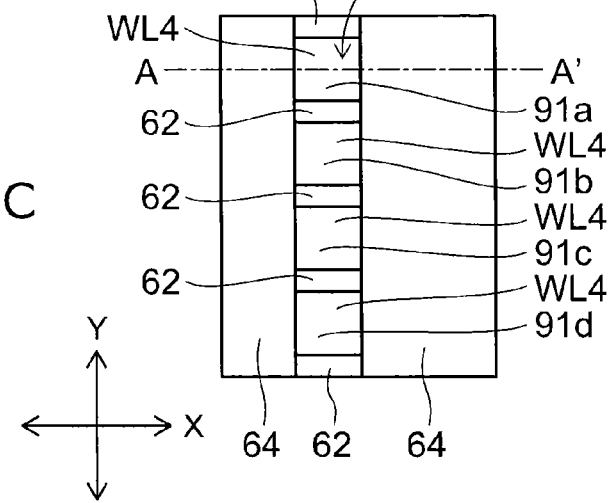

After forming the insulating film 61 and the insulating films 62, the (hard) mask layer 64 is formed on the stacked body of the contact region as shown in FIG. 13C. The mask layer 64 is made of a material different from the electrode layers WL1 to WL4 and the conductive layers 51 and has high etching selectivity with respect to the electrode layers WL1 to WL4 and the conductive layers 51. In other words, the mask layer 64 functions as a mask when etching the electrode layers WL1 to WL4 and the conductive layers 51 in subsequent processes.

Figure 16C:
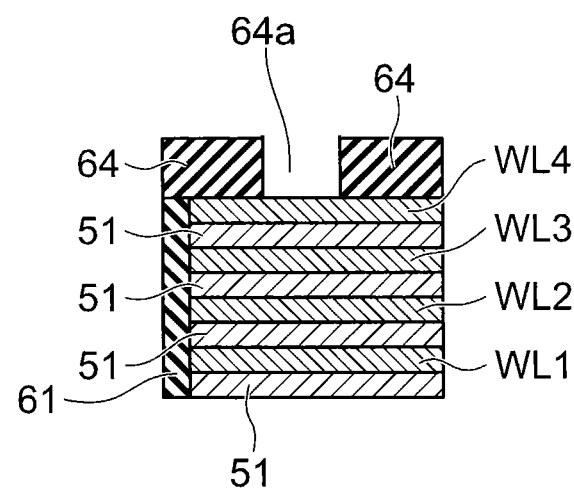

As shown in FIG. 13C and in FIG. 16C which is the A-A' cross-sectional view of FIG. 13C, an opening 64a is made in the mask layer 64. The opening 64a extends in the Y direction; and a portion of the regions 91a to 91d described above is exposed at the opening 64a. Accordingly, the surface of the electrode layer WL4 of the uppermost layer of each of the regions 91a to 91d is exposed.

Figure 14A:
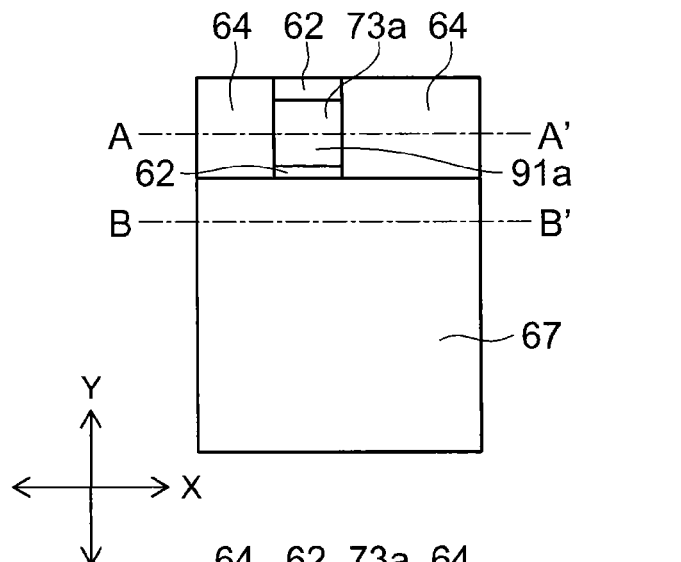

As shown in FIG. 14A, a resist film 67 is formed on the mask layer 64. After the resist film 67 is formed on the entire surface of the mask layer 64 to fill the opening 64a, the resist film 67 is patterned by exposing and developing. Of the four regions 91a to 91d shown in FIG. 13C, first, the region 91a is exposed by the patterning.

Then, the stacked body of the region 91a is etched by, for example, RIE using the resist film 67 and the mask layer 64 as a mask.

Figure 17A:
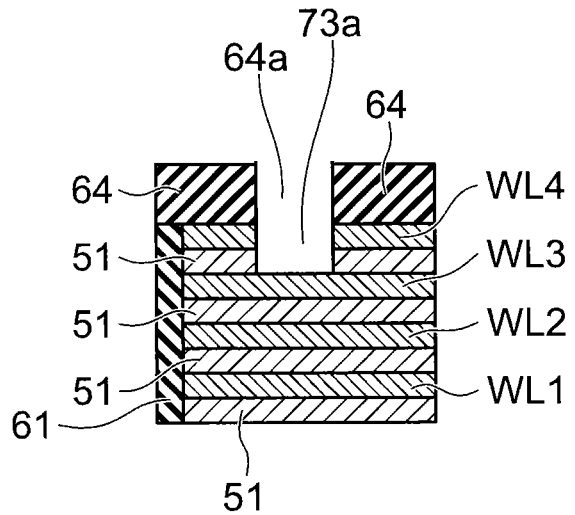

As shown in FIG. 17A which is the A-A' cross-sectional view of FIG. 14A, the electrode layer WL4 of the uppermost layer and one layer of the conductive layers 51 stacked under the electrode layer WL4 are removed by being selectively etched. Thereby, a trench 73a is made in the region 91a.

Figure 19A:
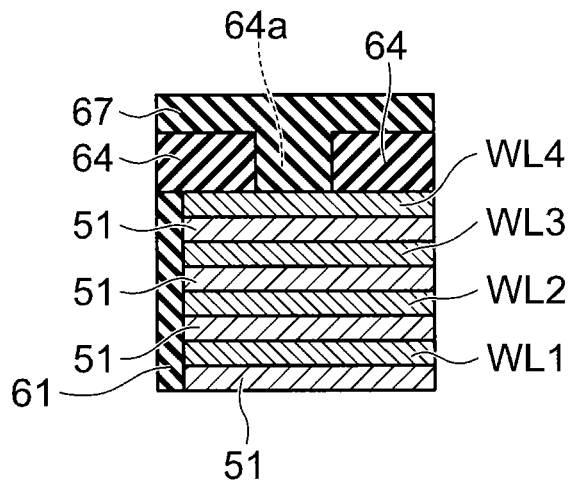

At this time, as shown in FIG. 14A and FIG. 19A which is the B-B' cross-sectional view of FIG. 14A, the region 91b is covered with the resist film 67; and the stacked body is not etched. Similarly, the regions 91c and 91d are covered with the resist film 67; and the stacked bodies are not etched.

Figure 14B:
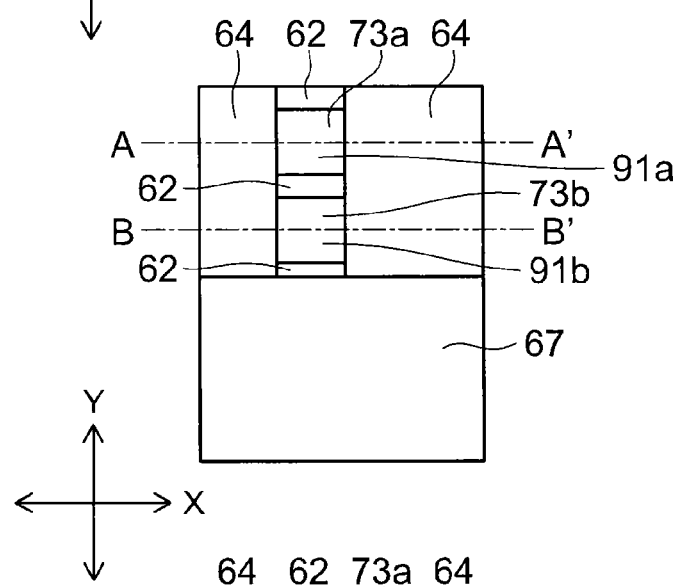
Figure 19B:
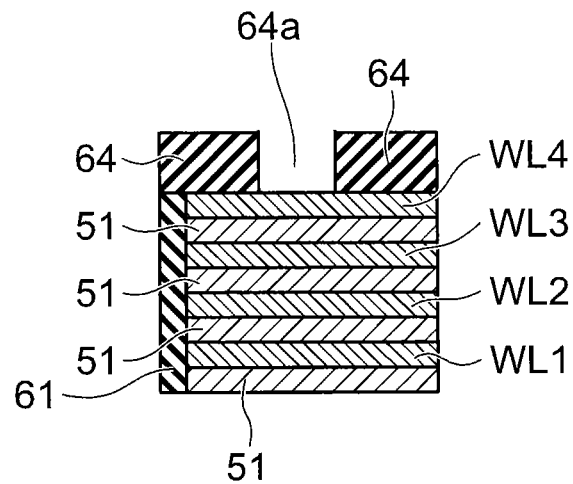

Then, the planar size of the resist film 67 is reduced by performing ashing of the resist film 67 using, for example, a gas including oxygen. Thereby, as shown in FIG. 14B, the region 91b is exposed from the resist film 67 in addition to the region 91a. In other words, as shown in FIG. 19B, the surface of the electrode layer WL4 of the uppermost layer in the region 91b is exposed.

Then, the stacked bodies of the regions 91a and 91b exposed from the resist film 67 and the mask layer 64 are etched by RIE.

Figure 19C:
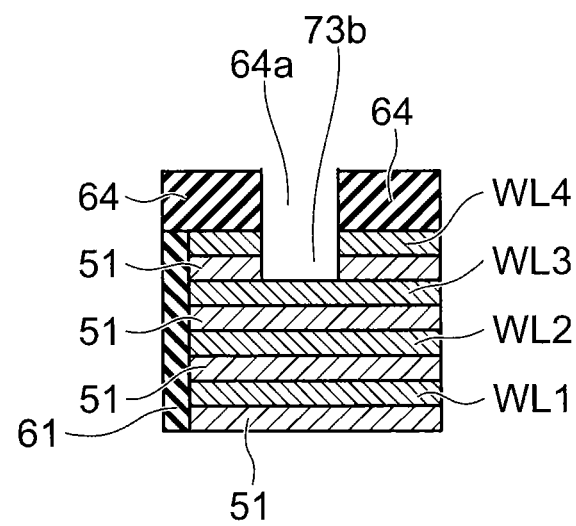

As shown in FIG. 19C which is the B-B' cross-sectional view of FIG. 14B, a trench 73b is made in the region 91b by the electrode layer WL4 of the uppermost layer and one layer of the conductive layers 51 stacked under the electrode layer WL4 in the region 91b being removed by selective etching.

Figure 17B:
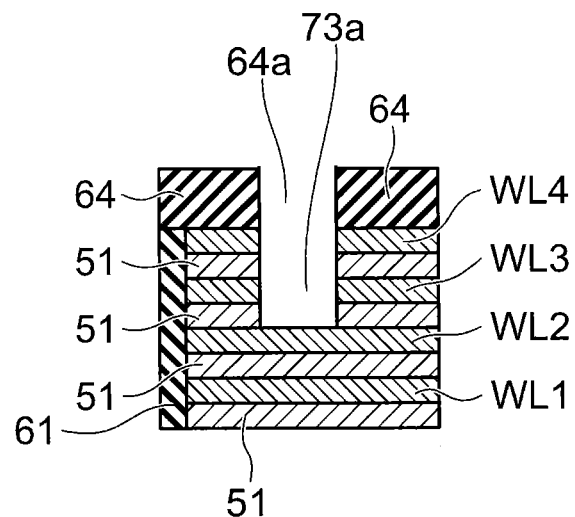

In the region 91a where the electrode layer WL4 and the one layer of the conductive layers 51 under the electrode layer WL4 are already etched by the previous process, the electrode layer WL3 and one layer of the conductive layers 51 stacked under the electrode layer WL3 are removed by being etched further as shown in FIG. 17B which is the A-A' cross-sectional view of FIG. 14A. Thereby, the trench 73a of the region 91a has a depth that reaches the electrode layer WL2.

At this time, the stacked bodies of the regions 91c and 91d that had been covered with the resist film 67 are not etched.

Figure 14C:
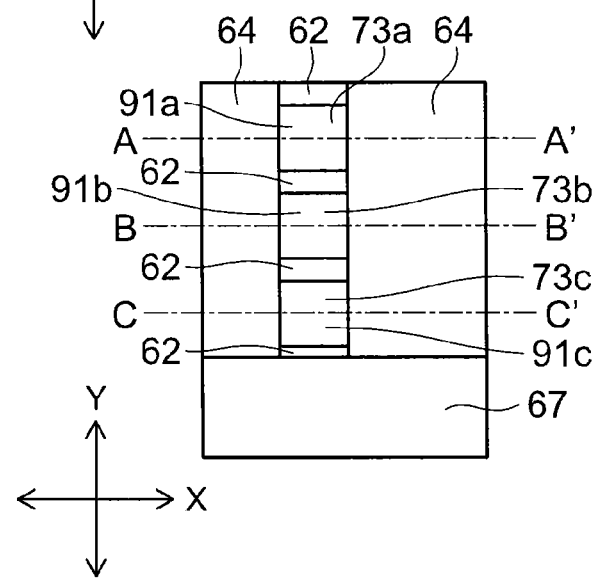

Then, again, the planar size of the resist film 67 is reduced by performing ashing of the resist film 67 using, for example, a gas including oxygen. Thereby, as shown in FIG. 14C, the region 91c is exposed from the resist film 67 in addition to the regions 91a and 91b. In other words, the surface of the electrode layer WL4 of the uppermost layer in the region 91c is exposed.

Then, the stacked bodies of the regions 91a to 91c exposed from the resist film 67 and the mask layer 64 are etched by RIE.

Figure 22A:
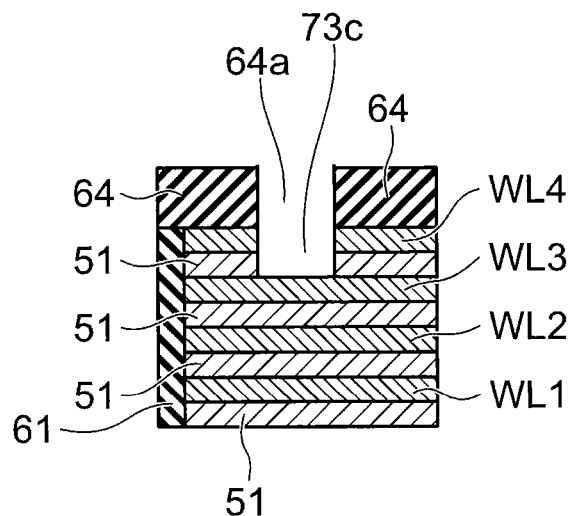

As shown in FIG. 22A which is the C-C' cross-sectional view of FIG. 14C, a trench 73c is made in the region 91c by the electrode layer WL4 of the uppermost layer and one layer of the conductive layers 51 stacked under the electrode layer WL4 in the region 91c being removed by selective etching. The trench 73c of the region 91c reaches the electrode layer WL3.

Figure 17C:
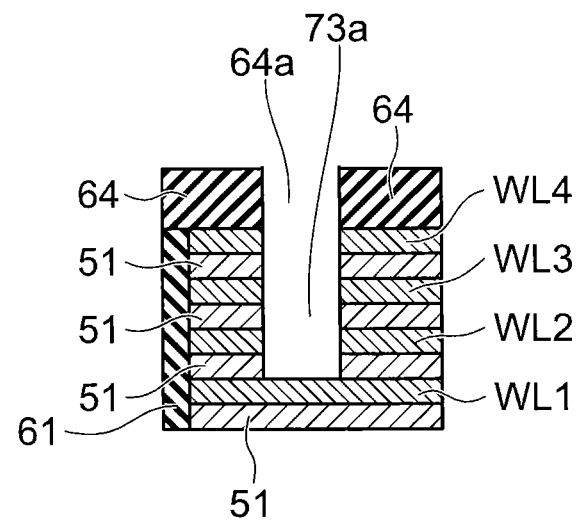

Also, in the region 91a, the electrode layer WL2 and one layer of the conductive layers 51 stacked under the electrode layer WL2 are removed by being etched further as shown in FIG. 17C which is the A-A' cross-sectional view of FIG. 14C. Thereby, the trench 73a of the region 91a has a depth that reaches the electrode layer WL1.

Figure 20A:
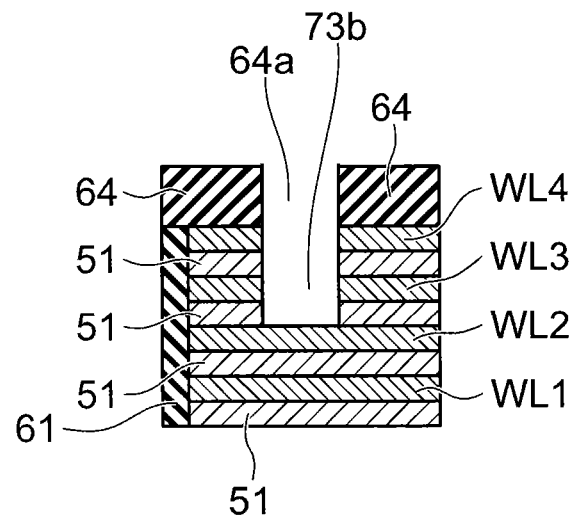

Further, in the region 91b, the electrode layer WL3 and one layer of the conductive layers 51 stacked under the electrode layer WL3 are removed by being etched further as shown in FIG. 20A which is the B-B' cross-sectional view of FIG. 14C. Thereby, the trench 73b of the region 91b has a depth that reaches the electrode layer WL2.

At this time, the stacked body of the region 91d that had been covered with the resist film 67 is not etched.

As described above, the trenches 73a to 73c having different depths are made respectively in the regions 91a to 91c by repeating the process of increasing the number of the regions 91a to 91c exposed from the mask layer 64 and the resist film 67 by reducing the planar size of the resist film 67 and the process of etching one layer of the electrode layers WL4, WL3, and WL2 and one layer of the conductive layers 51.

The trench 73a made in the region 91a reaches the electrode layer WL1 by piercing the electrode layers WL4, WL3, and WL2 and three layers of the conductive layers 51 as shown in FIG. 17C.

The trench 73b made in the region 91b reaches the electrode layer WL2 by piercing the electrode layers WL4 and WL3 and two layers of the conductive layers 51 as shown in FIG. 20A.

The trench 73c made in the region 91c reaches the electrode layer WL3 by piercing the electrode layer WL4 and one layer of the conductive layers 51 as shown in FIG. 22A.

Accordingly, the trenches 73a to 73c having different depths are arranged in a stairstep configuration in the Y direction.

The slimming that reduces the planar size of the resist film 67 is replaceable using patterning by lithography.

Figure 24A:
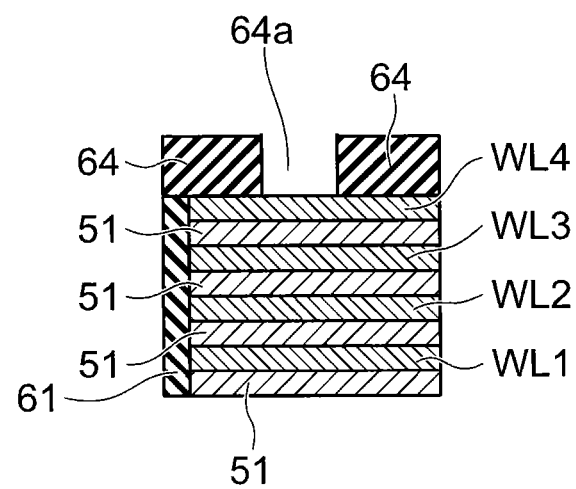

After making the trenches 73a to 73c, the resist film 67 that was left is removed. Thereby, the region 91d also is exposed; and the electrode layer WL4 of the uppermost layer of the region 91d is exposed as shown in FIG. 24A. The stacked body is not etched in the region 91d.

Figure 18A:
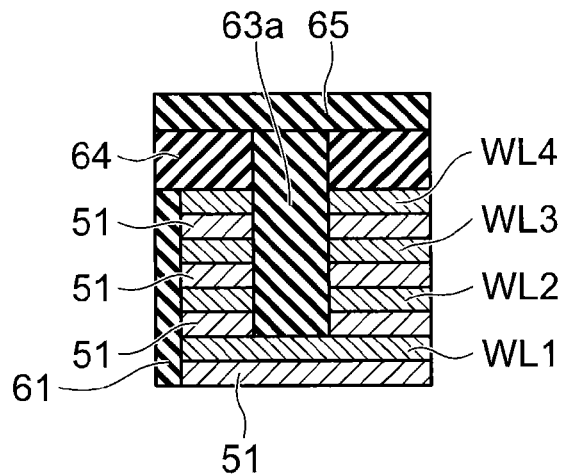

Then, as shown in FIG. 18A, the insulating film 63a is filled into the trench 73a of the region 91a and the opening 64a of the mask layer 64.

Figure 20B:
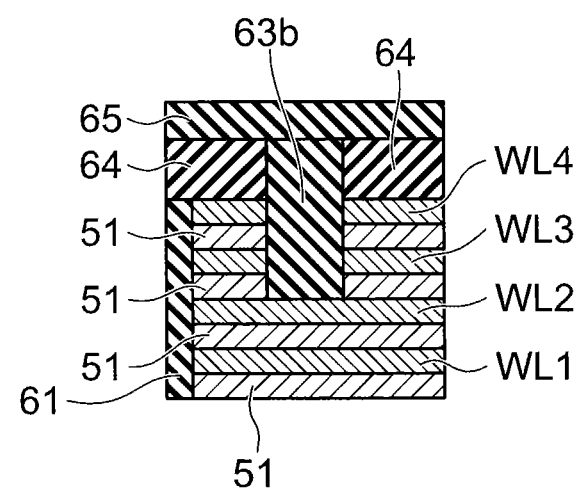

Also, as shown in FIG. 20B, the insulating film 63b is filled into the trench 73b of the region 91b and the opening 64a of the mask layer 64.

Figure 22B:
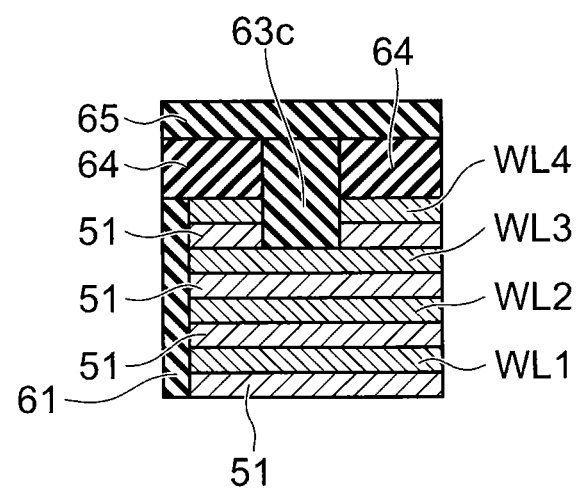

Also, as shown in FIG. 22B, the insulating film 63c is filled into the trench 73c of the region 91c and the opening 64a of the mask layer 64.

Figure 24B:
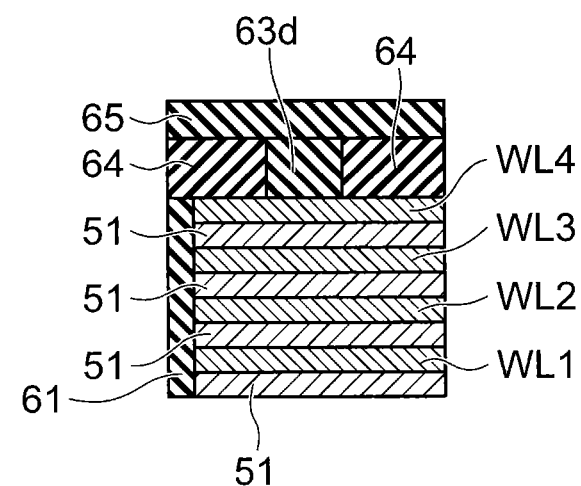

Also, as shown in FIG. 24B, the insulating film 63d is filled into the opening 64a of the mask layer 64 of the region 91d.

Figure 15A:
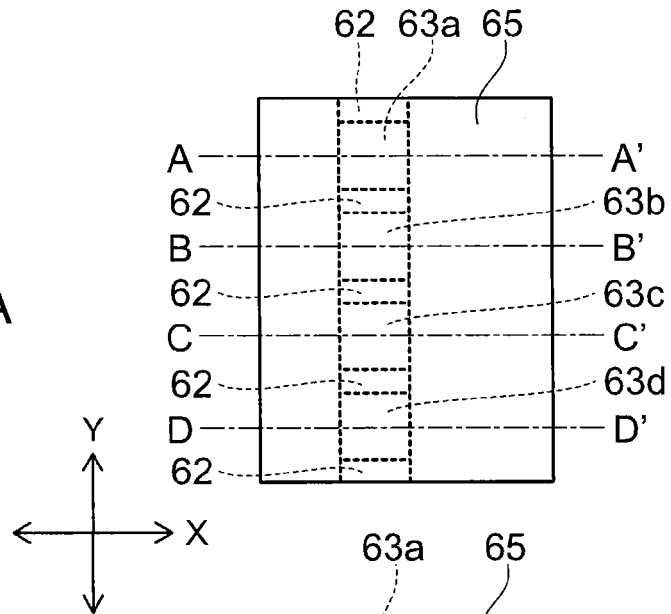

The insulating film 65 shown in FIG. 15A is formed on the stacked body of the contact region. The insulating film 65 is formed on the mask layer 64, on the insulating film 63a, on the insulating film 63b, on the insulating film 63c, and on the insulating film 63d.

FIG. 18A, FIG. 20B, FIG. 22B, and FIG. 24B are an A-A' cross-sectional view, a B-B' cross-sectional view, a C-C' cross-sectional view, and a D-D' cross-sectional view of FIG. 15A, respectively.

The insulating films 63a to 63d and the insulating film 65 are formed simultaneously from the same material (e.g., a silicon oxide film).

Figure 15B:
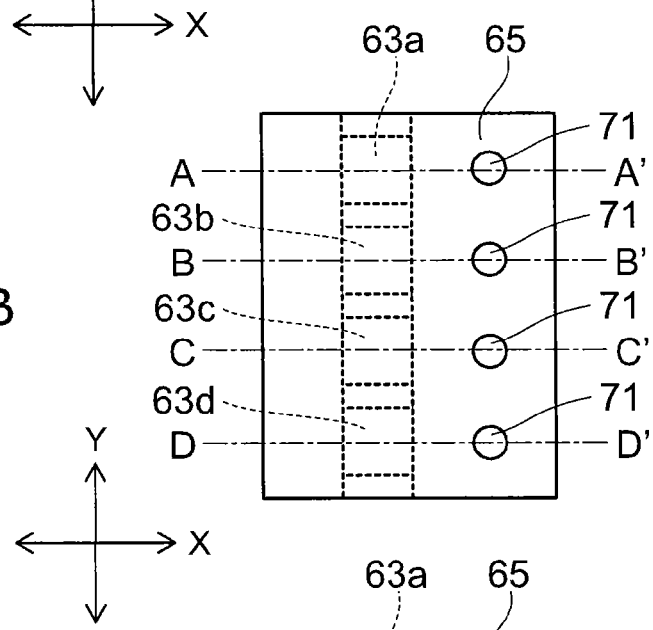

Multiple holes 71 are made in the stacked body as shown in FIG. 15B after forming the insulating films 63a to 63d and the insulating film 65.

Figure 18B:
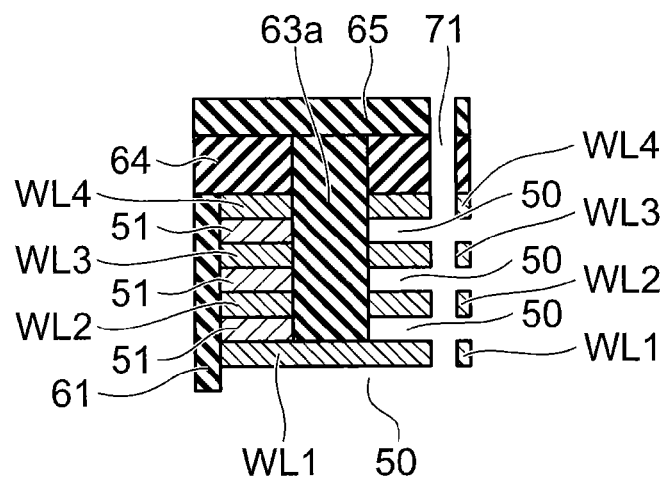
Figure 21A:
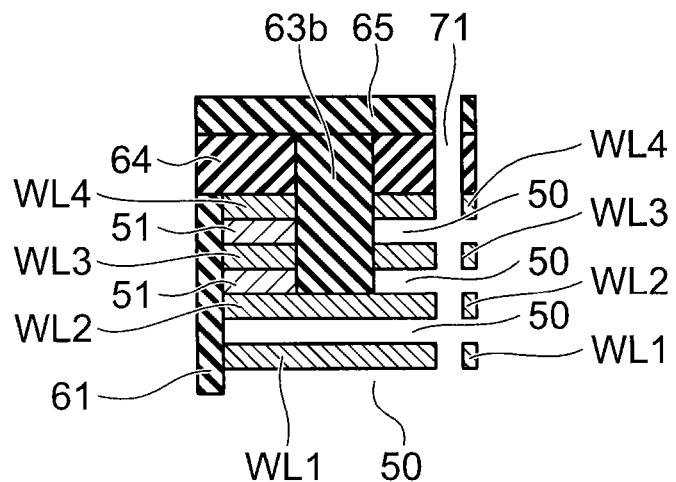
Figure 23A:
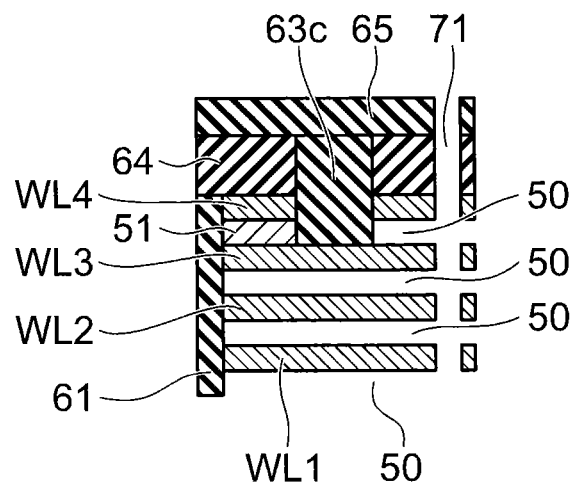
Figure 25A:
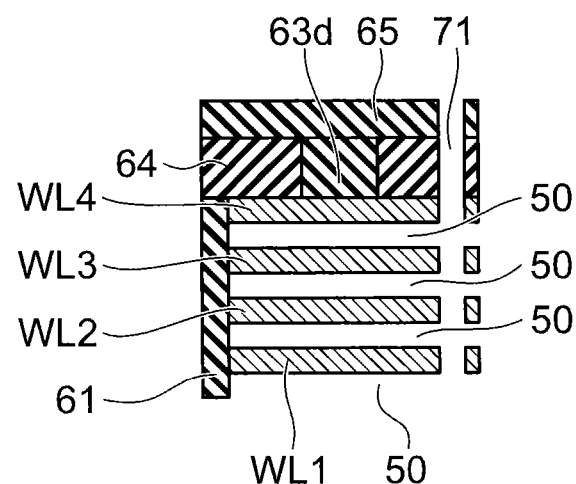

The holes 71 pierce the stacked body of the insulating film 65, the mask layer 64, the multiple electrode layers WL1 to WL4, and the multiple conductive layers 51 as shown in FIG. 18B which is the A-A' cross-sectional view of FIG. 15B, FIG. 21A which is the B-B' cross-sectional view of FIG. 15B, FIG. 23A which is the C-C' cross-sectional view of FIG. 15B, and FIG. 25A which is the D-D' cross-sectional view of FIG. 15B.

When the stacked body is viewed in plan, the holes 71 are made in a region that is on the outer side of the region enclosed with the insulating film 61, the insulating films 62, the insulating films 63a to 63d and on the outer side of the side walls of the insulating films 63a to 63d on the side opposite to the side walls on the insulating film 61 side.

Then, as shown in FIG. 18B, FIG. 21A, FIG. 23A, and FIG. 25A, the conductive layers 51 other than the conductive layers 51 between the insulating film 61 and each of the insulating films 63a to 63c are removed by etching via the holes 71.

Similarly to the memory cell array 1 described above, the etchant is selected according to the combination of the materials of the electrode layers WL1 to WL4 and the conductive layers 51.

The conductive layers 51 other than the conductive layers 51 between the insulating film 63a and the insulating film 61 shown in FIG. 18B, the conductive layers 51 between the insulating film 63b and the insulating film 61 shown in FIG. 21A, and the conductive layers 51 between the insulating film 63c and the insulating film 61 shown in FIG. 23A are removed by etching via the holes 71.

The electrode layers WL1 to WL4, the insulating film 61, the insulating films 62, the insulating films 63a to 63d, the mask layer 64, and the insulating film 65 remain without being removed.

The gap 50 is made between the electrode layers WL from which the conductive layers 51 are removed.

The columnar conductor made of the electrode layers WL4, WL3, and WL2 and the conductive layers 51 between the insulating film 63a and the insulating film 61 shown in FIG. 18B is enclosed with the insulating film 61, the insulating films 62, and the insulating film 63a. Also, the electrode layer WL1 that is not to be removed by the etching is provided under the columnar conductor. Accordingly, the etchant does not penetrate via the holes 71 and the gap 50 to the conductive layers 51 between the insulating film 63a and the insulating film 61; and the conductive layers 51 between the insulating film 63a and the insulating film 61 are not etched.

The columnar conductor made of the electrode layers WL4 and WL3 and the conductive layers 51 between the insulating film 63b and the insulating film 61 shown in FIG. 21A is enclosed with the insulating film 61, the insulating films 62, and the insulating film 63b. Also, the electrode layer WL2 that is not to be removed by the etching is provided under the columnar conductor. Accordingly, the etchant does not penetrate via the holes 71 and the gap 50 to the conductive layers 51 between the insulating film 63b and the insulating film 61; and the conductive layers 51 between the insulating film 63b and the insulating film 61 are not etched.

The columnar conductor made of the electrode layer WL4 and the conductive layer 51 between the insulating film 63c and the insulating film 61 shown in FIG. 23A is enclosed with the insulating film 61, the insulating films 62, and the insulating film 63c. Also, the electrode layer WL3 that is not to be removed by the etching is provided under the columnar conductor. Accordingly, the etchant does not penetrate via the holes 71 and the gap 50 to the conductive layer 51 between the insulating film 63c and the insulating film 61; and the conductive layer 51 between the insulating film 63c and the insulating film 61 is not etched.

Figure 15C:
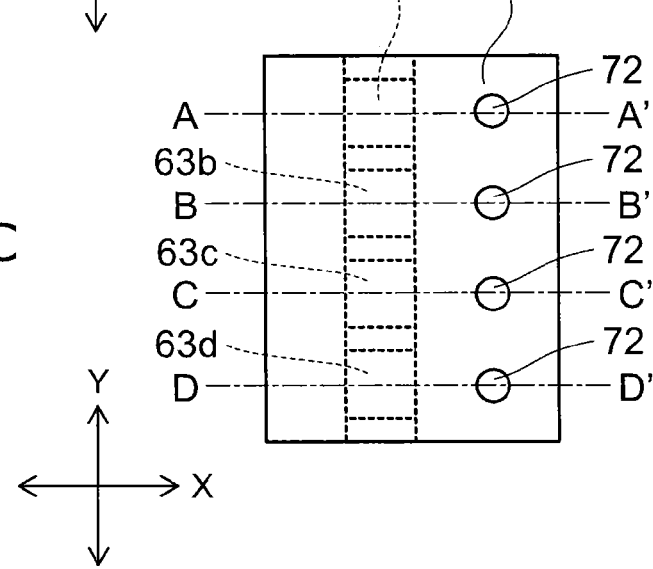
Figure 18C:
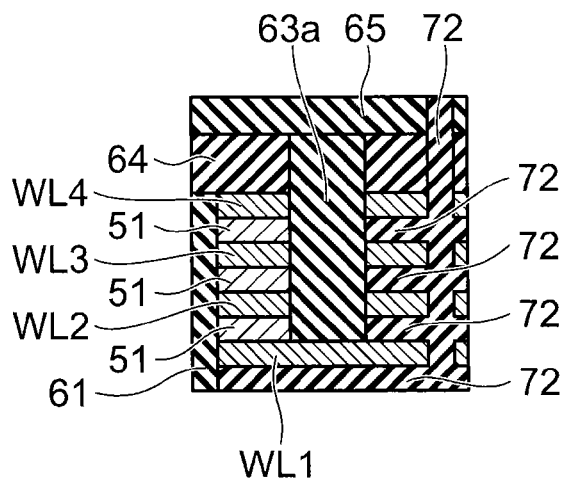
Figure 21B:
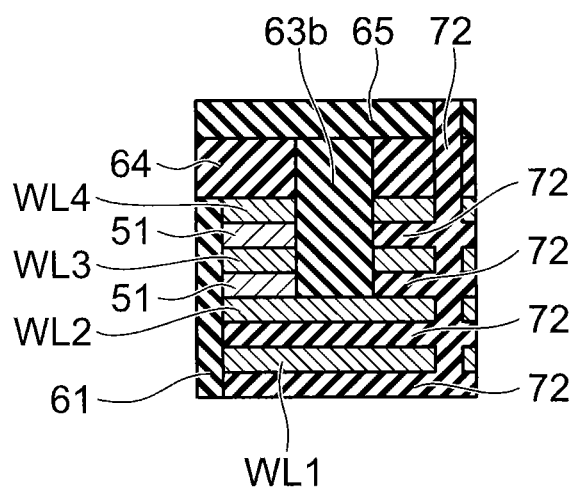
Figure 23B:
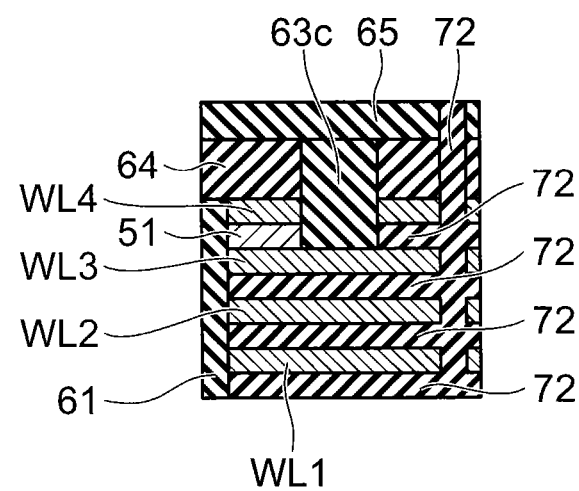
Figure 25B:
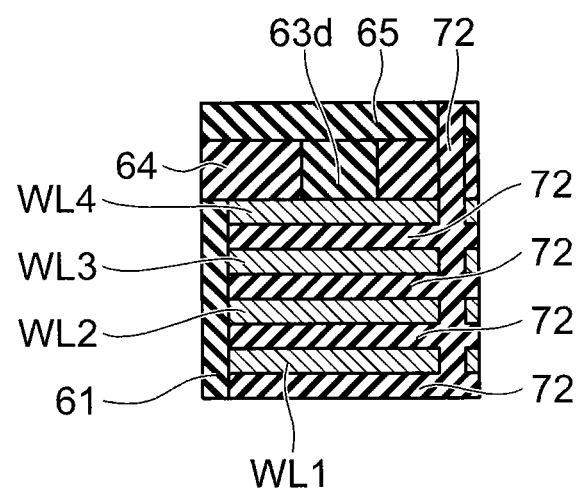

After removing the conductive layers 51, the insulating film 72 is formed in the gap 50 made by the conductive layers 51 being removed as shown in FIG. 15C, FIG. 18C which is the A-A' cross-sectional view of FIG. 15C, FIG. 21B which is the B-B' cross-sectional view of FIG. 15C, FIG. 23B which is the C-C' cross-sectional view of FIG. 15C, and FIG. 25B which is the D-D' cross-sectional view of FIG. 15C. The insulating film 72 is formed in the gap 50 via the holes 71; and the insulating film 72 also is formed inside the holes 71.

After forming the insulating film 72 as shown in FIG. 11, the contact electrode 81a is formed in a region 92a enclosed with the insulating film 63a, the insulating film 61, and the insulating films 62; the contact electrode 81b is formed in a region 92b enclosed with the insulating film 63b, the insulating film 61, and the insulating films 62; the contact electrode 81c is formed in a region 92c enclosed with the insulating film 63c, the insulating film 61, and the insulating films 62; and the contact electrode 81d is formed in a region 92d enclosed with the insulating film 63d, the insulating film 61, and the insulating films 62.

As shown in FIGS. 12A to D, each of the contact electrodes 81a to 81d connects to the electrode layer WL4 of the uppermost layer by piercing the insulating film 65 and the mask layer 64.

Not-shown multiple word interconnects are formed on the insulating film 65; and the contact electrodes 81a to 81d are respectively connected to the corresponding word interconnects.

After multiple contact holes reaching the electrode layer WL4 of the uppermost layer by piercing the insulating film 65 and the mask layer 64 are made simultaneously by RIE using a not-shown mask in each of the regions 92a to 92d shown in FIG. 11, the contact electrodes 81a to 81d including metallic elements as main components are filled into the contact holes.

The depths of the multiple contact holes are the same; and the multiple contact holes reach the same electrode layer WL4 of the uppermost layer.

Because the multiple contact holes having matching depths are made simultaneously, the control of the etching stop position is easier; and the contact holes can be prevented from extending through the upper electrode layer WL to undesirably reach the electrode layers WL under the upper electrode layer WL.

For example, a short defect can be prevented from occurring between the electrode layer WL4 and the electrode layer WL3 due to the contact hole in which the contact electrode 81d shown in FIG. 12D is formed undesirably reaching the electrode layer WL3 which is not to be contacted by piercing the electrode layer WL4 which is to be contacted.

Figure 26A:
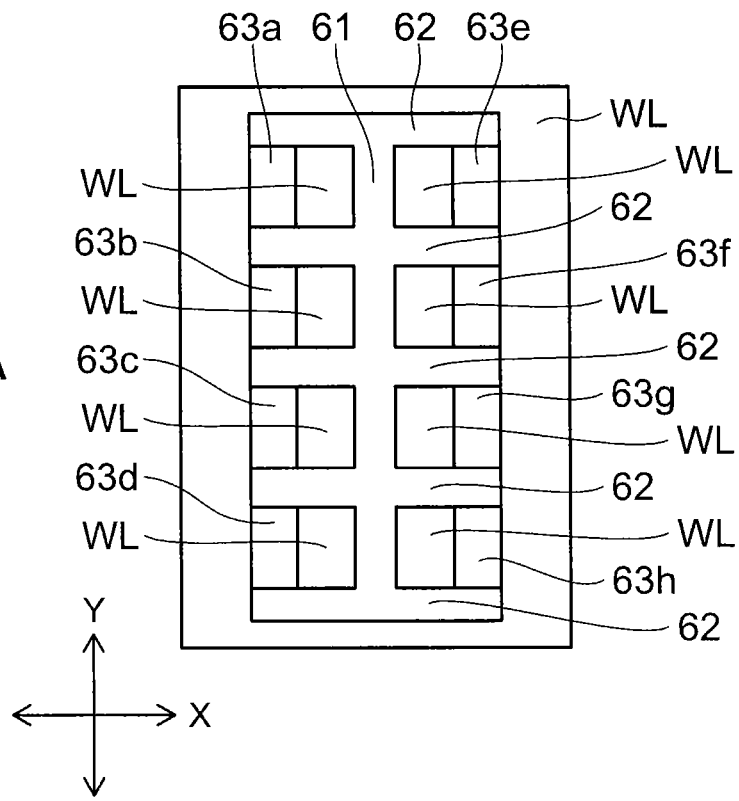
FIG. 26A to FIG. 27 are schematic top views showing another planar layout of the contact region of the semiconductor device of the embodiment.

FIG. 26A shows another specific example of a planar layout of the insulating film (the first insulating film) 61, the insulating films (the second insulating films) 62, and insulating films (third insulating films) 63a to 63h.

For example, eight layers of the electrode layers WL are formed; and eight insulating films 63a to 63h are formed to correspond to the number of layers of the electrode layers WL.

In other words, eight regions enclosed with the insulating film 61 extending in the Y direction, the insulating films 62 arranged in the Y direction to extend from the insulating film 61 in the X direction, and each of the insulating films 63a to 63h are formed; and the contact electrodes are formed on the electrode layer WL of the uppermost layer of the respective region to reach the electrode layer WL of the uppermost layer of the respective region.

Similarly to the insulating films 63a to 63d of the embodiment recited above, each of the insulating films 63a to 63h has a different depth and reaches the electrode layer WL of a different layer.

For example, similarly to the structure shown in FIG. 12D, the contact electrode formed in the region between the insulating film 63h and the insulating film 61 is connected to the electrode layer WL of the uppermost layer without the conductive layer 51 being interposed.

Then, similarly to the structure shown in FIGS. 12A to C, the contact electrodes other than the contact electrode connected to the electrode layer WL of the uppermost layer are connected respectively to the electrode layers WL of the different layers other than the electrode layer WL of the uppermost layer via the columnar conductors including the electrode layers WL and the conductive layers 51 between the insulating film 61 and each of the insulating films 63a to 63g.

In the layout shown in FIG. 26A, the column of the insulating films 63a to 63d arranged in the Y direction and the column of insulating films 63e to 63h arranged in the Y direction are arranged in the X direction to share the insulating film 61 extending in the Y direction between the columns.

By the insulating film 61 being shared between the column of the insulating films 63a to 63d and the column of the insulating films 63e to 63h, the increase of the surface area of the entire contact region can be suppressed in the case where the number of the contact electrodes increases and the regions where the contact electrodes are formed have a layout in which the regions are arranged in the X direction and the Y direction.

Figure 26B:
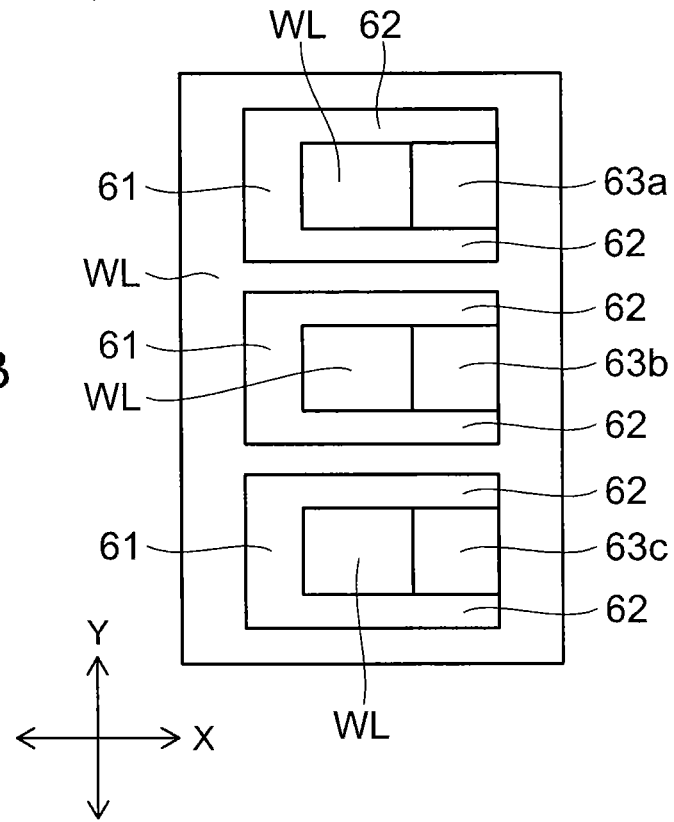

Also, as shown in FIG. 26B, the insulating film 61 may be divided in the Y direction; and the insulating films 62 may not be shared between the contact regions adjacent to each other in the Y direction.

Figure 27:
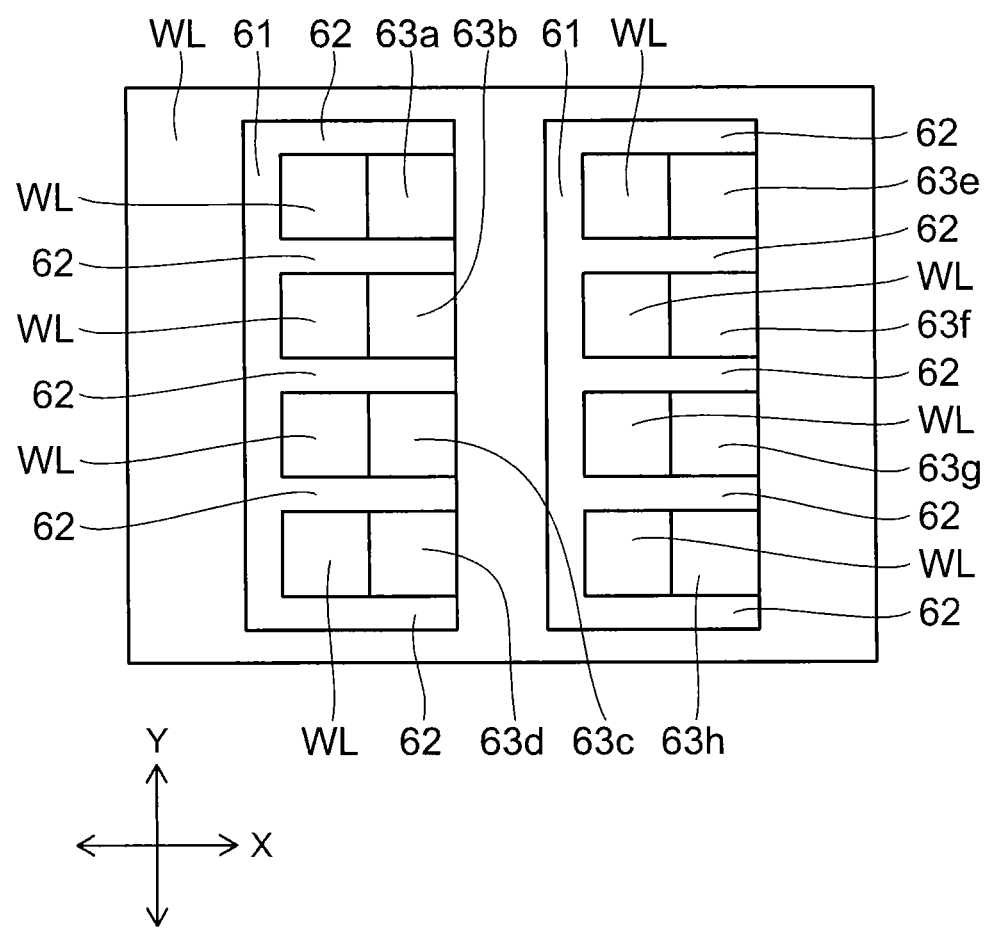

Also, in the structure of FIG. 26A, the insulating film 61 may not be shared between the column of the insulating films 63a to 63d and the column of the insulating films 63e to 63h; and the insulating films 61 may be formed respectively for the column of the insulating films 63a to 63d and the column of the insulating films 63e to 63h as shown in FIG. 27.

Another method for forming the contact structure according to the embodiment will now be described with reference to FIG. 28A to FIG. 29C.

Figure 28A:
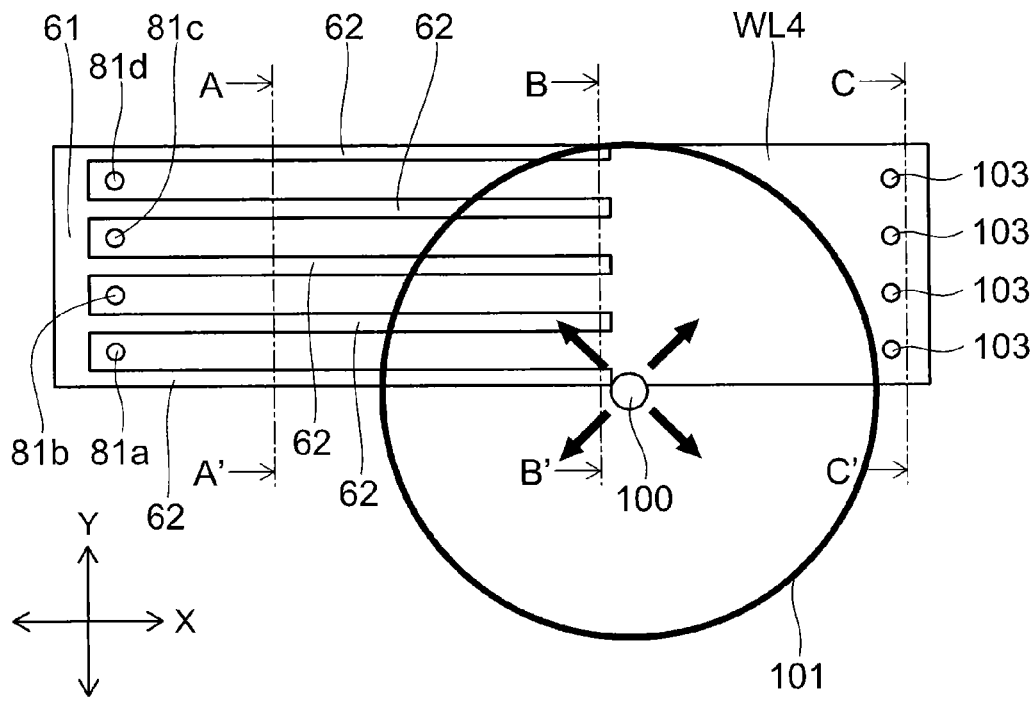
FIG. 28A to FIG. 29C are schematic views of another structure of the contact region of the semiconductor device of the embodiment.
Figure 29A:
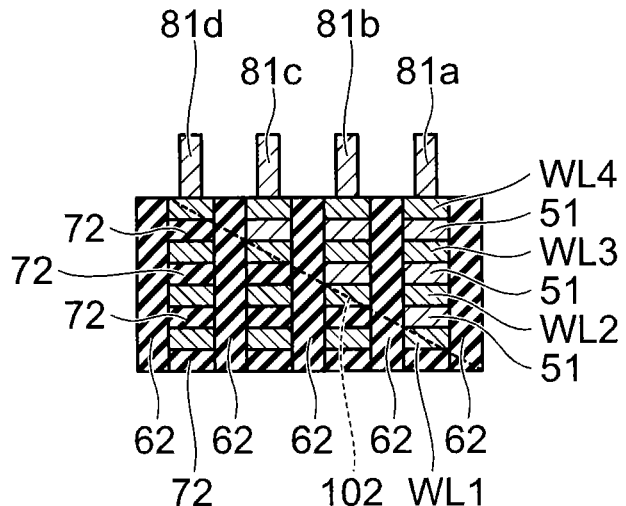
Figure 29B:
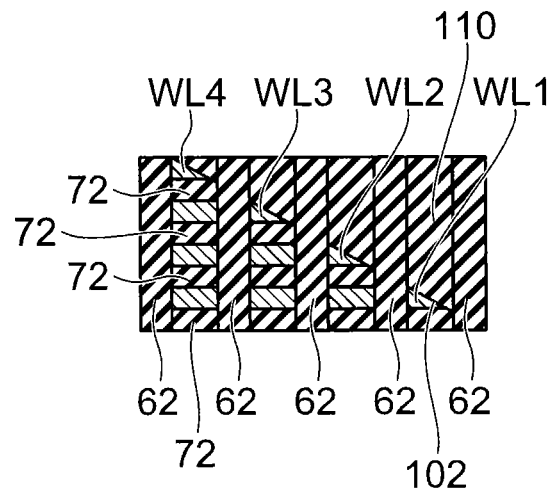
Figure 29C:
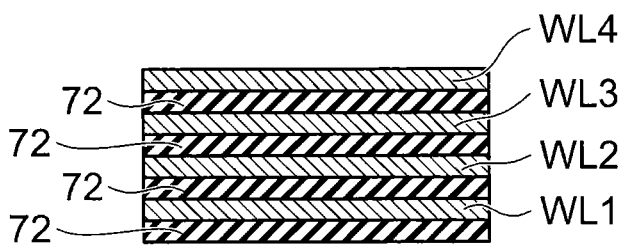

FIG. 28A is a schematic front view of the contact region.
FIG. 29A is an A-A' cross-sectional view of FIG. 28A.
FIG. 29B is a B-B' cross-sectional view of FIG. 28A.
FIG. 29C is a C-C' cross-sectional view of FIG. 28A.

Similarly to the embodiment described above, the electrode layers WL1 to WL4 and the conductive layers 51 are stacked alternately in the contact region.

In a portion of the stacked body as shown in FIG. 28A, the insulating film 61 extending in the Y direction and the multiple insulating films 62 arranged in the Y direction to extend from the insulating film 61 in the X direction are formed. The insulating film 61 pierces the stacked body. The insulating films 62 also pierce the stacked body as shown in FIGS. 29A to C.

Then, the stacked body is etched from an etching start point 100 schematically shown in FIG. 28A. The etching start point 100 is positioned on the outer side of the region enclosed with the insulating film 61 and the insulating films 62 proximally to the X-direction end portion of the end-most insulating film 62 of the multiple insulating films 62 arranged in the Y direction.

Figure 28B:
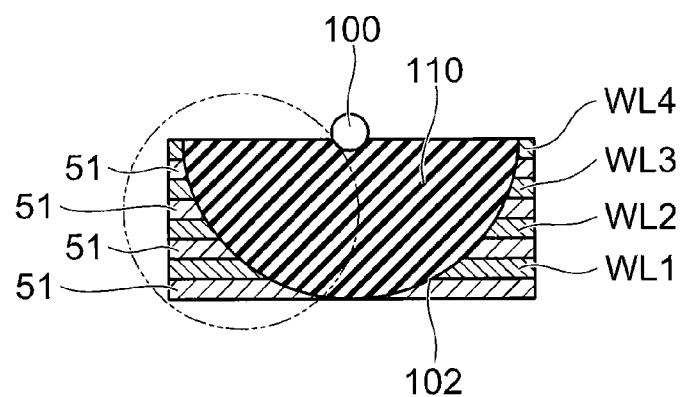

As schematically illustrated by the thick arrows and a circle 101 in FIG. 28A and as schematically illustrated by a curve 102 in FIG. 28B, the etching of the stacked body progresses to spread isotropically in the planar direction and the depth direction with the etching start point 100 as the center.

As shown in FIG. 28B, an insulating film 110 is filled into the portion from which the stacked body is removed by the etching with the etching start point 100 as the center.

After forming the insulating film 110, the conductive layers 51 are removed by etching via holes 103 shown in FIG. 28A made in a region on the outer side of the region enclosed with the insulating film 61 and the insulating films 62 and on the outer side of the region where the insulating film 110 is formed (the region inside the circle 101). Similarly to the embodiment described above, an appropriate etchant is selected according to the combination of the materials of the electrode layers WL1 to WL4 and the conductive layers 51; and the conductive layers 51 are removed to leave the electrode layers WL1 to WL4.

The insulating film 72 is formed via the holes 103 recited above into the gap between the electrode layers WL1 to WL4 made by the conductive layers 51 being removed.

However, as shown in FIG. 29A which is the A-A' cross-sectional view of FIG. 28A, the conductive layers 51 are left in the portion where the penetration of the etchant is blocked by the insulating film 110 formed in the previous process.

The insulating film 110 is formed in the region on the inner side of the circle 101 shown in FIG. 28A. By making the holes 103 in the region on the outer side of the region on the inner side of the circle 101 and on the outer side of the region enclosed with the insulating film 61 and the insulating films 62 and by removing the conductive layers 51 via the holes 103, all of the conductive layers 51 are replaced with the insulating film as shown in FIG. 29C in the portion of the C-C' cross-sectional view of FIG. 28A.

FIG. 29B which is the B-B' cross-sectional view of FIG. 28A is positioned in the region on the inner side of the circle 101 where the insulating film 110 is formed and corresponds to the cross section inside the double dot-dash line of FIG. 28B. Although the etching front is illustrated by the curve 102 in FIG. 28B, the etching front is approximated as the oblique surface (the oblique line) 102 in FIG. 29B.

In the cross section of FIG. 29B, the conductive layers 51 of the portion under the etching front where the insulating film 110 is not filled are removed and are replaced with the insulating film 72.

In FIG. 29A (the A-A' cross-sectional view of FIG. 28A) showing the cross section of the region positioned on the outer side of the region on the inner side of the circle 101 where the insulating film 110 is formed and on the side opposite to the holes 103 with the insulating film 110 interposed, the insulating film 110 is formed in the page surface depth direction; and the bottom of the insulating film 110 (the etching front) is illustrated by the broken line 102.

At the portion higher than the bottom of the insulating film 110, the etchant is blocked by the insulating film 110; and the conductive layers 51 are left.

At the portion lower than the bottom of the insulating film 110, the conductive layers 51 are removed and are replaced with the insulating film 72 because the etchant is not blocked by the insulating film 110.

As a result, in the cross-sectional portion of FIG. 29A, the conductor made of the electrode layers WL4, WL3, WL2, and WL1 and the three layers of the conductive layers 51 between the electrode layers WL4, WL3, WL2, and WL1 is left between the insulating film 62 of the rightmost side and the insulating film 62 that is second from the right. The contact electrode 81a is connected to the electrode layer WL1 of the lowermost layer via the conductor.

Also, the conductor made of the electrode layers WL4, WL3, and WL2 and the two layers of the conductive layers 51 between the electrode layers WL4, WL3, and WL2 is left between the insulating film 62 that is second from the right and the insulating film 62 that is third from the right. The contact electrode 81b is connected to the electrode layer WL2 via the conductor.

Further, a conductor made of the electrode layers WL4 and WL3 and the one layer of the conductive layers 51 between the electrode layers WL4 and WL3 is left between the insulating film 62 that is third from the right and the insulating film 62 that is fourth from the right. The contact electrode 81c is connected to the electrode layer WL3 via the conductor.

Also, the conductive layers 51 between the electrode layers WL1 to WL4 between the leftmost insulating film 62 and the insulating film 62 that is second from the left are replaced with the insulating film 72; and the contact electrode 81d connects only the electrode layer WL4 of the uppermost layer.

In the embodiment shown in FIG. 28A to FIG. 29C as well, the depths of the multiple contact holes filled with the contact electrodes 81a to 81d are the same; and the multiple contact holes reach the same electrode layer WL4 of the uppermost layer.

Accordingly, because the multiple contact holes having matching depths are made simultaneously, the control of the etching stop position is easier; and the contact holes can be prevented from extending through the upper electrode layer WL to undesirably reach the electrode layers WL under the upper electrode layer WL.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A method for manufacturing a semiconductor device, comprising:
    forming a stacked body on a substrate, the stacked body including a plurality of first conductive layers including a metallic element as a main component and a plurality of second conductive layers including a metallic element as a main component provided respectively between the first conductive layers;
    making a hole to pierce the stacked body;
    making a slit to divide the stacked body;
    making a gap between the first conductive layers by removing the second conductive layers by etching via the slit or the hole;
    forming a memory film including a charge storage film at a side wall of the hole; and
    forming a channel body on an inner side of the memory film inside the hole.

2. The method for manufacturing the semiconductor device according to claim 1, further comprising forming an insulating film on an uppermost layer of the first conductive layer to leave the gap.

3. The method for manufacturing the semiconductor device according to claim 1, further comprising forming an insulating film on an uppermost layer of the first conductive layer and inside the gap.

4. The method for manufacturing the semiconductor device according to claim 1, wherein the first conductive layers and the second conductive layers include the same metallic element as the main components and are formed continuously inside the same chamber.

5. The method for manufacturing the semiconductor device according to claim 4, wherein the first conductive layers are titanium films, and the second conductive layers are titanium nitride films.

6. The method for manufacturing the semiconductor device according to claim 4, wherein the first conductive layers are tungsten films including silicon, and the second conductive layers are tungsten films including boron.

7. The method for manufacturing the semiconductor device according to claim 4, wherein the first conductive layers are aluminum films, and the second conductive layers are aluminum nitride films.

8. The method for manufacturing the semiconductor device according to claim 1, wherein the first conductive layers are copper films, and the second conductive layers are titanium films or tantalum films.

9. The method for manufacturing the semiconductor device according to claim 1, wherein the first conductive layers are aluminum films, and the second conductive layers are titanium films.

10. The method for manufacturing the semiconductor device according to claim 1, wherein the first conductive layers are tungsten films, and the second conductive layers are titanium films or tantalum films.

11. The method for manufacturing the semiconductor device according to claim 1, wherein the first conductive layers are nickel films, and the second conductive layers are titanium films or tantalum films.

12. The method for manufacturing the semiconductor device according to claim 1, wherein the first conductive layers are cobalt films, and the second conductive layers are titanium films.

13. The method for manufacturing the semiconductor device according to claim 1, further comprising:
    forming a first insulating film in a region of a portion of the stacked body to pierce the stacked body and extend in a first direction parallel to a major surface of the substrate;
    forming a plurality of second insulating films to pierce the stacked body and extend from the first insulating film in a second direction intersecting the first direction in a plane parallel to the major surface of the substrate;
    forming a third insulating film to reach the first conductive layer of a different layer in each region of the stacked body between the second insulating films adjacent to each other in the first direction;
    making a second hole to pierce the stacked body on an outer side of a region of the stacked body enclosed with the first insulating film, the second insulating films, and the third insulating film;
    removing the second conductive layers other than the second conductive layers stacked in contact with the first conductive layers between the first insulating film and the third insulating film by etching via the second hole;
    forming a fourth insulating film via the second hole into the gap made by the second conductive layers being removed; and
    forming a contact electrode on the first conductive layer of the uppermost layer of the region enclosed with the first insulating film, the second insulating films, and the third insulating film to connect to the first conductive layer of the uppermost layer.

14. A method for manufacturing a semiconductor device, comprising:
    forming a stacked body on a substrate, the stacked body including a plurality of first conductive layers including a metallic element as a main component and a plurality of second conductive layers including a metallic element as a main component provided respectively between the first conductive layers;
    forming a first insulating film in a region of a portion of the stacked body to pierce the stacked body and extend in a first direction parallel to a major surface of the substrate;
    forming a plurality of second insulating films to pierce the stacked body and extend from the first insulating film in a second direction intersecting the first direction in a plane parallel to the major surface of the substrate;
    forming a third insulating film to reach the first conductive layer of a different layer in each region of the stacked body between the second insulating films adjacent to each other in the first direction;

making a hole to pierce the stacked body on an outer side of a region of the stacked body enclosed with the first insulating film, the second insulating films, and the third insulating film;

removing the second conductive layers other than the second conductive layers stacked in contact with the first conductive layers between the first insulating film and the third insulating film by etching via the hole;

forming a fourth insulating film via the hole in the gap made by the second conductive layers being removed; and forming a contact electrode on the first conductive layer of the uppermost layer of the region enclosed with the first insulating film, the second insulating films, and the third insulating film to connect to the first conductive layer of the uppermost layer.

15. The method for manufacturing the semiconductor device according to claim 14, wherein the forming of the third insulating film includes:

covering the stacked body other than a region where the third insulating film is to be formed with a mask layer of a material different from the first conductive layers and the second conductive layers after forming the first insulating film and the second insulating films;

making a plurality of trenches to respectively reach the first conductive layers of the different layers by etching the stacked body exposed from the mask layer; and filling the third insulating film into the trenches.

16. The method for manufacturing the semiconductor device according to claim 15, wherein the trenches are made by repeating:

etching one layer of the first conductive layers and one layer of the second conductive layers in a region between the second insulating films exposed from the mask layer and a resist film formed on the mask layer; and reducing a planar size of the resist film to increase the number of the regions between the second insulating films exposed from the mask layer and the resist film, and etching one layer of the first conductive layers and one layer of the second conductive layers.

17. The method for manufacturing the semiconductor device according to claim 14, wherein the first conductive layers and the second conductive layers include the same metallic element as the main components and are formed continuously inside the same chamber.

* * * * *